US006562189B1

(12) United States Patent
Quiles et al.

(10) Patent No.: US 6,562,189 B1
(45) Date of Patent: May 13, 2003

(54) PLASMA REACTOR WITH A TRI-MAGNET PLASMA CONFINEMENT APPARATUS

(75) Inventors: Efrain Quiles, San Jose, CA (US); Hamid Noorbakhsh, Fremont, CA (US); James D Carducci, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/654,248

(22) Filed: Aug. 31, 2000

Related U.S. Application Data

(60) Provisional application No. 60/205,819, filed on May 19, 2000.

(51) Int. Cl.[7] ............................. H01L 21/00; C23C 16/00
(52) U.S. Cl. ........................... 156/345.43; 156/345.44; 156/345.47; 156/345.48; 118/723 E; 118/723 I; 118/723 R
(58) Field of Search ...................... 156/345; 118/723 E, 118/723 I, 723 R; 204/298.37

(56) References Cited

U.S. PATENT DOCUMENTS

| | | | | |
|---|---|---|---|---|
| 6,030,486 A | * | 2/2000 | Loewenhardt et al. | 156/345 |
| 6,074,512 A | * | 6/2000 | Collins et al. | 156/345 |
| 6,077,384 A | * | 6/2000 | Collins et al. | 156/345 |
| 6,168,726 B1 | * | 1/2001 | Li et al. | 216/79 |
| 6,218,312 B1 | * | 4/2001 | Collins et al. | 438/723 |
| 6,220,607 B1 | * | 4/2001 | Schneider et al. | 277/650 |
| 6,238,588 B1 | * | 5/2001 | Collins et al. | 216/68 |
| 6,340,435 B1 | * | 1/2002 | Bjorkman et al. | 216/72 |

FOREIGN PATENT DOCUMENTS

| | | |
|---|---|---|
| EP | 0 786 794 A2 | 7/1997 |
| EP | 0 892 422 A2 | 1/1999 |

OTHER PUBLICATIONS

Patent Abstracts of Japan, Publication No. 07022389, Jan. 24, 1995 (Hitachi Ltd).

* cited by examiner

Primary Examiner—Gregory Mills
Assistant Examiner—Michelle Crowell
(74) Attorney, Agent, or Firm—Robert M. Wallace; Joseph Bach

(57) ABSTRACT

A plasma reactor includes a chamber adapted to support an evacuated plasma environment, a passageway connecting the chamber to a region external of the chamber, the passageway being defined by spaced opposing passageway walls establishing a passageway distance therebetweeen, and a plasma-confining magnet assembly adjacent the passageway. The plasma-confining magnet assembly includes a short magnet adjacent one of the passageway walls and having opposing poles spaced from one another by a distance which a fraction of the gap distance, the short magnet having a magnetic orientation along one direction transverse to the direction of the passageway, and a long magnet adjacent the other one of the opposing passageway walls and generally facing the short magnet across the passageway and having opposing poles spaced from one another along a direction transverse to the passageway by a pole displacement distance which is at least nearly as great as the gap distance, the long magnet having a magnetic orientation generally opposite to that of the short magnet.

64 Claims, 17 Drawing Sheets

PLASMA REACTOR WITH A TRI-MAGNET PLASMA CONFINEMENT APPARATUS

This application claims the benefit of provisional application No. 60/205,819, filed May 19, 2000.

BACKGROUND OF THE INVENTION

The invention is related to plasma reactors in which the reactor chamber containing the plasma and the workpiece is maintained at a pressure less than atmospheric by pumping gas out of the chamber through a pumping annulus or throat. One problem is that the plasma process produces various chemical species which tend to contaminate the pumping apparatus and the surface of the pumping annulus as they are pumped out of the chamber. For example, plasma processes designed to etch silicon dioxide films, without etching silicon films or photoresist, typically employ a polymer precursor gas (such as a fluorocarbon gas) which tends to form a protective polymer film over silicon and photoresist surfaces that would otherwise be exposed to etchants in the plasma chamber. Such a film tends to not form over silicon dioxide surfaces, so that the etch selectivity to silicon dioxide is significantly improved. A problem is that the polymer accumulates as a very hard semi-permanent film on any surface exposed to the processing environment, including the pumping annulus and the pumping apparatus, unless somehow prevented from doing so.

A solution to the problem of polymer contamination is to permit the polymer film to deposit on surfaces within the primary process region over the workpiece, but block polymer precursor species from leaving the primary process region and specifically blocking the polymer precursor species from entering the pumping annulus of the reactor. This is accomplished by exploiting the fact that the polymer precursor species tend to be ionized in the plasma and may therefore be deflected by magnetic fields. Thus, plasma confinement magnets are placed around the entrance to the pumping annulus. As disclosed in U.S. Pat. No. 6,030,486, issued Feb. 29, 2000, to Loewenhardt et al., and U.S. patent application Ser. No. 09/773,409, filed Jan. 31, 2001 by Loewenhardt et al., a pair of horseshoe magnets may be placed across the entrance to the pumping annulus to deflect all ionized particles and thereby prevent them from entering the pumping annulus. The horseshoe magnets are relatively expensive. Other techniques for confining the ionized particles are also commonly used, such as baffle arrangements ahead of the pumping annulus. One such baffle arrangement entails imposing an "S-curve" in the wall at the entrance of the pumping annulus. The S-curve in the wall is such that there are no straight-line paths through the entrance of the pumping annulus. As a result, the particles entering the pumping annulus tend to collide with the wall of the annulus in the vicinity of the S-curve. For an appropriately proportioned S-curve, at least nearly all of the polymer precursor species collide with the wall in the vicinity of the S-curve and are deposited thereon before they can reach the interior of the pumping annulus or the pumping apparatus.

As technology advances, the workpiece size increases. For example, in microelectronic circuit fabrication, the workpiece is a silicon wafer whose diameter may reach or exceed 12 inches. This size increase leads to greater difficulty in maintaining uniform gas flow across the wafer surface, particularly at low chamber pressures. For very low chamber pressures and very large wafer diameters, the gas flow rate through the pumping annulus must be very high to maintain the low chamber pressure and uniform gas flow across the wafer surface. The larger the wafer diameter, the greater must be the gas flow rate through the pumping annulus. It has been found, for example, that for a 200 mm diameter wafer, in order to maintain a chamber pressure of 40 mT, a gas flow rate of about 100 cubic centimeters per second is required. In processing a larger wafer such as a 300 mm diameter wafer, an even lower chamber pressure may be required, such as 20 mT. In this case, a gas flow rate of about 200 cubic centimeters per second through the pumping annulus is required, and it is often difficult to maintain or even reach such a high flow rate in a conventional chamber sufficiently large to hold a 300 mm wafer.

One feature which severely limits the gas flow through the pumping annulus, and often prevents the gas flow from reaching the requisite level, are the baffle arrangements at the entrance to the pumping annulus, which has been referred to above. These necessarily induces turbulence that significantly impedes the gas flow. It appears that neither increasing the pump power nor "smoothing" the baffling are viable solutions to this problem. As for increasing the pump power, we have found that for a large wafer size (e.g., 300 mm diameter) and a target chamber pressure that is low (e.g., 20 mT), the impedance induced by the baffling is such that the requisite gas flow rate cannot be reached even if the pump power is increased. Also "smoothing" of the baffling or widening of the throat size of the pumping annulus in an attempt to increase the gas flow detracts from the ability of the baffle to block polymer precursor species, and therefore does not appear to be a practical solution to the problem.

What is needed is an inexpensive way of blocking polymer precursor species from the pumping annulus without impeding gas flow through the pumping annulus.

SUMMARY OF THE DISCLOSURE

A plasma reactor includes a chamber-adapted to support an evacuated plasma environment, a passageway connecting the chamber to a region external of the chamber, the passageway being defined by spaced opposing passageway walls establishing a passageway,distance therebetweeen, and a plasma-confining magnet assembly adjacent the passageway. The plasma-confining magnet assembly includes a short magnet adjacent one of the passageway walls and having opposing poles spaced from one another by a distance which a fraction of the gap distance, the short magnet having a magnetic orientation along one direction transverse to the direction of the passageway, and a long magnet adjacent the other one of the opposing passageway walls and generally facing the short magnet across the passageway and having opposing poles spaced from one another along a direction transverse to the passageway by a pole displacement distance which is at least nearly as great as the gap distance, the long magnet having a magnetic orientation generally opposite to that of the short magnet.

DETAILED DESCRIPTION OF THE PREFERRED EMBODIMENTS

Figure 1:
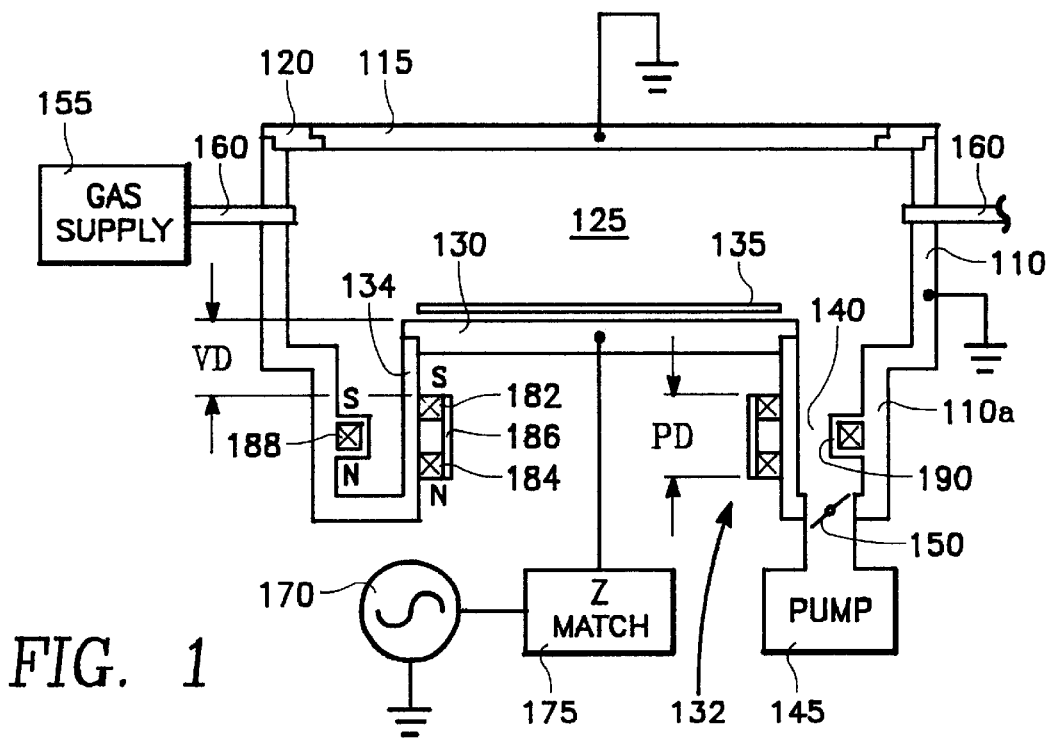
FIG. 1 is a cut-away side view of a plasma reactor in accordance with a first embodiment of the invention employing a tri-magnet configuration.

FIG. 1 illustrates a capacitively coupled plasma reactor whose walls define a vacuum chamber comprised of a cylindrical side wall 110, a disk-shaped conductive ceiling 115 separated from the side wall 110 by an insulator ring 120, the side wall 110 and ceiling 115 defining a chamber interior 125, and a base assembly which includes a workpiece support pedestal 130 surrounded by a wall 134 to support a workpiece 135 such as a silicon wafer. A pumping annulus 140 extends below the chamber interior 125 and is coupled to a vacuum pump 145 via a butterfly valve 150. The pumping annulus is enclosed by the pedestal wall 134 on one side and by the lower portion of the side wall 110. Process gases are introduced into the chamber interior 125 from a process gas supply 155 via gas inlets 160. Plasma source power is provided by an RF power generator 170 coupled through an impedance match circuit 175 to the workpiece support pedestal 130. The conductive ceiling 115 is grounded and therefore serves as the return electrode for RF power delivered to the pedestal 130. In addition, the chamber side wall 110 may be conductive and may be grounded to serve as an additional return electrode. Although a capacitively coupled plasma source is described, the invention is advantageously employed in combination with any plasma source, including inductively coupled sources and helicon sources, among others.

The pump 145 maintains the chamber interior 125 and the pumping annulus at an evacuated pressure below atmospheric which can approach vacuum conditions. The interior region surrounded by the pedestal wall 134 and the exterior region outside the sidewall 110 are free of plasma and are at atmospheric pressure.

In order to block ionized particles or plasma from entering the pumping annulus 140, a set of three plasma confinement magnets is employed. The set of three magnets includes a pair of magnets 182, 184 connected by a steel bar 186 is housed within the interior region 132 of the wafer support 130, and is preferably attached to the interior surface of the wall 134 of the workpiece support 130. As will be described in greater detail later in this specification, the poles of the individual magnets 182, 184 are oriented oppositely so that the magnet pair 182, 184 and the steel bar 186 together form a horseshoe magnet, in which the top is the south pole and the bottom is the north pole, as indicated in FIG. 1. On the opposite side of the pumping annulus 140 and facing the center of the horseshoe magnet is the third magnet, namely a single individual magnet 188 which is attached to the inner surface of the side wall 110. The three magnets 182, 184, 188 constitute what is referred to in this specification as a tri-magnet apparatus. The distance across the "gap" of the pumping annulus is the difference between the radius of the lower sidewall section 110a and the radius of the pedestal wall 134, and is about the same as the "gap" between the "inside" horseshoe magnet 182, 184, 186 and the "outside" individual magnet 188.

Significantly, only the individual third magnet 188 requires special measures to protect it from the corrosive action of the plasma, because it is located within the interior chamber processing environment, e.g. the pumping annulus 140, and is therefore exposed to the plasma. The horseshoe magnet 182, 184, 186 is on the atmospheric side of the support pedestal wall 134 and therefore is not exposed to the plasma. An advantage of this feature is that is relatively inexpensive to protect the individual magnet 188 because of its small size and simple structure. Such protection can be provided, for example, by a thin (50 mil) aluminum coating 190 around the individual magnet 188. By comparison, if the more complex and larger horseshoe magnet 182, 184, 186 were placed on the plasma or vacuum side of the pedestal wall 134, a much greater expense would be entailed, due to its more complex and larger structure. This is particularly true in embodiments (which are explored in more detail later in this specification) in which magnets on the vacuum side of either wall (either the side wall 110 or the pedestal wall 134) are mounted on removable/disposable chambers liners that protect the walls. In such embodiments, the cost of replacing the liner is increased by the cost of any plasma containment magnet mounted therein. Replacement cost of the horseshoe magnet is relatively high and for the individual magnet 188 is relatively low. Thus, a significant cost savings is realized in the invention, in which only the small individual magnet need be mounted on the vacuum side of the wall.

We have found that it is necessary to widen the pumping annulus 140 in order to achieve the requisite gas flow rate. Conventionally, for smaller wafer sizes (e.g., 200 mm diameter) and higher chamber pressures (e.g., 140 mT), a fairly narrow pumping annulus gap of about 0.75 inch is sufficiently wide to provide the requisite gas flow rate. At the same time, the 0.75 inch gap is sufficiently narrow so that a simple magnetic confinement arrangement (e.g., two individual magnets facing each other across the gap) can block the plasma from the pumping annulus. A larger gap size has not been practical since it was not possible to block plasma across a significantly larger gap using a simple magnetic confinement arrangement. The problem is that for larger wafer sizes (e.g., 300 mm diameter), it is necessary to nearly triple the width of the pumping annulus to about 2.5 inches in order to reach a low chamber pressure such as 20 mT, whether or not the pump power is increased. Thus, the distance between the pedestal wall 134 and the outer side wall 110a at the pumping annulus 140 is 2.5 inches. Such a large gap prevents conventional plasma confinement techniques such as baffling or a pair of simple magnets across the gap from blocking the plasma from the pumping annulus.

Thus, it has seemed impossible to process such large wafers without incurring significant risk of plasma flowing into the pumping annulus and reaching the pump. This problem is solved by the tri-magnet apparatus.

The tri-magnet apparatus can replace baffling (thus removing impediments to gas flow) and more importantly permits the gap to be widened to 2.5 inches (or possibly more) while effectively confining the plasma. We have found that one way of obtaining superior magnetic confinement of the plasma by the tri-magnet apparatus is to mount the individual magnet 188 on the interior surface of the side wall 110a in order to reduce the distance between it and the horseshoe magnet 182, 184, 186. An advantage of this embodiment of the tri-magnet apparatus is that it is relatively inexpensive to protect the small individual magnet 188 from the plasma by means of encapsulation or a coating such as the aluminum coating 190. The horseshoe magnet 182, 184, 186 is mounted on the exterior side of the wall 110 to avoid having to incur the greater expense of protecting the larger horseshoe magnet from the plasma.

As briefly alluded to above, we have found that it is only necessary that one of the two magnetic elements (the horseshoe magnet and the individual magnet 188) be mounted within the plasma in order to reduce the distance to the other magnetic element and thereby optimize performance. An advantage of the tri-magnet apparatus is that the smaller of the two elements (i.e., the individual magnet 188) can be selected as the one mounted within the plasma (i.e., on the vacuum side of the wall), so that the cost of protecting the one magnetic element exposed to the plasma is greatly reduced. For example, if disposable liners are employed covering the side wall and the pedestal wall, then any of the magnets of the tri-magnet assembly on the vacuum side of the side wall or pedestal wall would be encapsulated within the respective liner. The liners are replaced whenever wear and tear (or polymer deposition thereon) produces significant changes in plasma processing conditions (e.g., changes in the plasma load impedance). The cost of replacing the liner includes the cost of any magnets embedded therein. The individual magnet 188 is relatively inexpensive compared to the horseshoe magnet. Therefore, placing only the individual magnet 188 on the vacuum side of the enclosure provides a significant advantage in cost savings.

We have found that care must be taken to ensure that the distance between the individual magnet 188 and the horseshoe magnet 182, 184, 186 be sufficiently small and the strengths of each of the three magnets 182, 184, 188 be sufficiently great to provide a strong magnetic field across the opening to the pumping annulus to deflect plasma ions. Otherwise, an insufficient magnetic field may actually promote the travel of plasma into the pumping annulus 140. In order to prevent this, the gap or distance between the two magnetic elements (i.e., the horseshoe magnet and the individual magnet 188) may be reduced, or the strengths of the magnets 182, 184, 188 be increased. Thus, while it would appear the gap size may be increased (to increase gas flow) provided the magnetic strength is increased, a greater magnetic strength is not desireable because of the risk of increasing magnetic fields on the wafer or workpiece 135, a which would increase the probability of device damage. Thus, it would not appear the gap can be significantly increased.

However, we have discovered a way of maintaining sufficient magnetic field strength across the gap (i.e., across the pumping annulus 140) without having to increase the strengths of the individual magnets 182, 184, 188. Specifically, we have discovered that a larger gap size (a larger pumping annulus) may be accommodated without appreciable loss of magnetic field strength across the gap by increasing the distance between the two magnets 182, 184 of the horseshoe magnet. This distance is referred to herein as the pole displacement (PD) of the horseshoe magnet (and depicted in FIG. 1), and will be discussed in detail later in this specification. Such an increase in the pole displacement requires that the steel backing 186 be lengthened accordingly. Thus, as the gap size increases, the magnetic field strength across the gap may be preserved by increasing the pole displacement of the horseshoe magnet.

The magnetic field directly above the horseshoe magnet turns out to be less than that directly above the individual magnet 188, as will be explored later in this specification. Accordingly, in order advantageously to minimize the magnetic field adjacent the periphery of workpiece 135, and thus avoid plasma nonuniformities across the wafer, it is preferable that the horseshoe magnet 182, 184, 186 be the portion of the tri-magnet assembly which is nearest the workpiece support pedestal 130, and that the individual magnet 188 be on the opposite side of the pumping annulus 140 (i.e., furthest from the workpiece support pedestal).

The vertical displacement (VD) between the top of the horseshoe magnet 182, 184, 186 and the plane of the wafer 135 may be increased. This reduces magnetic field strength at the wafer 135 or, equivalently, permits the magnets 182, 184, 188 to be stronger (e.g., to allow a larger gap across the pumping annulus 140 for a greater gas flow rate) without a concomitant increase in magnetic field strength at the wafer. Adjusting the vertical displacement typically entails vertically shifting the entire tri-magnet apparatus to achieve a desired vertical displacement for a given pole displacement.

The tri-magnet apparatus can facilitate a number of ways to improve the gas flow rate through the pumping annulus 140. First, the replacement of baffling with magnetic confinement improves the gas flow. Secondly, increasing the gap across the pumping annulus 140 without a concomitant loss in magnetic field strength is facilitated by increasing the pole displacement of the horseshoe magnet. Third, the gap may be further widened while preserving magnetic field strength across the gap by increasing the strength of the individual magnets, in which case a corresponding increase in the magnetic field at the wafer is avoided by increasing the vertical displacement between the tri-magnet configuration and the plane of the wafer 135.

We have found that the tri-magnet configuration makes possible for the first time the plasma processing of 300 mm diameter wafers at a low chamber pressure on the order of only 20 mT with good gas flow across the wafer. This is because the tri-magnet configuration enabled us to improve gas flow by widening the pumping annulus gap from 0.75 inches to 2.5 inches while magnetically blocking plasma from traveling through the pumping annulus 140. Moreover, the magnetic confinement of the plasma by the tri-magnet apparatus eliminates any need for baffling expedients, thus removing that impediment to gas flow. Sufficient magnetic field strength was due in part to a sufficiently large pole displacement of the horseshoe magnet. Suppression of magnetic field strength in the plane of the wafer was accomplished by a sufficiently large vertical displacement between the wafer plane and the tri-magnet assembly. Having thus broken the barrier for processing wafers as large as 300 mm at low pressure (20 mT), it is anticipated that the ability to scale the tri-magnet configuration to cope with ever-widening pumping annulus gaps as described above will continue to push the barrier back even further. Such scaling is facilitated by adjusting the pole displacement of the horseshoe magnet 182, 184, 186, adjusting the magnetic strength of the magnets 182, 184, 188 and concomitantly adjusting the vertical displacement between the tri-magnet assembly and the wafer plane, as referred to above.

Figure 2:
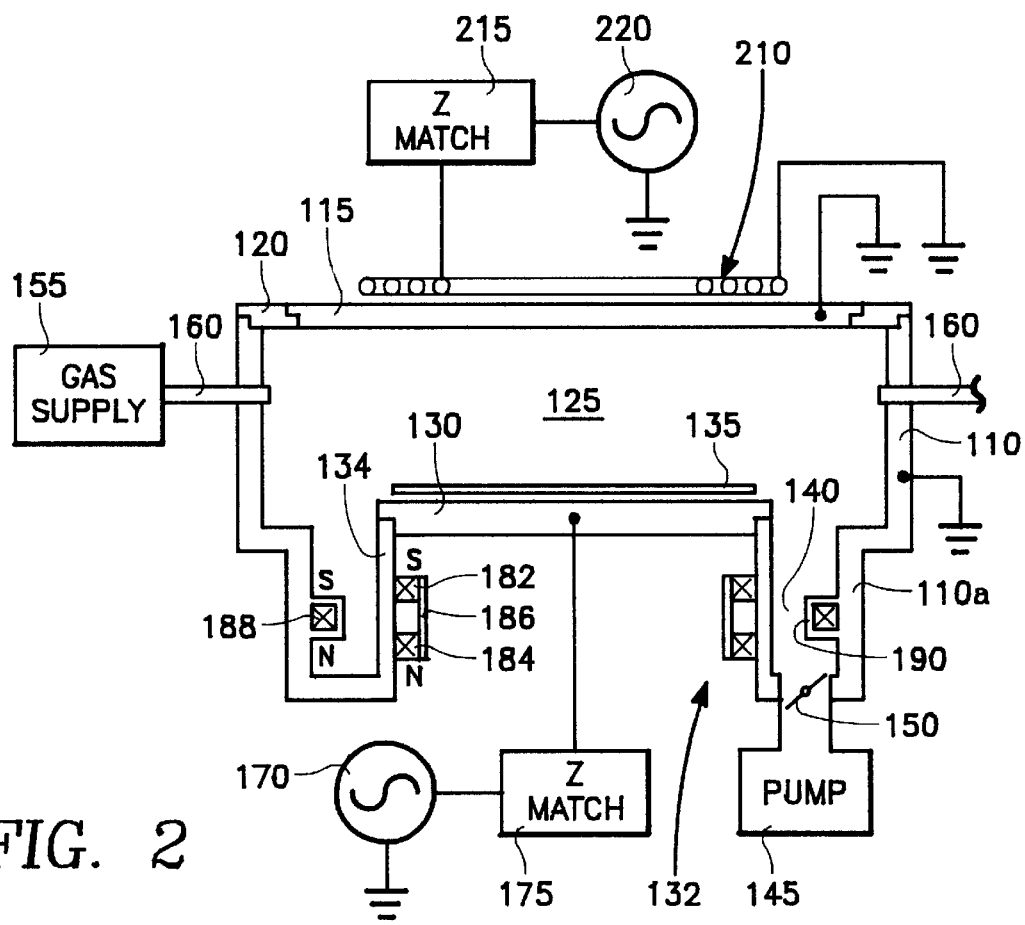
FIG. 2 illustrates a variation of the embodiment of FIG. 1 in which plasma source power is inductively coupled.

FIG. 2 illustrates a variation of the embodiment of FIG. 1 in which plasma source power is inductively coupled from an overhead coil antenna 210 connected through an impedance match circuit 215 to an RF power generator 220. The RF power generator 170 is typically used in the embodiment of FIG. 2 to control the bias power on the wafer 135.

Figure 3:
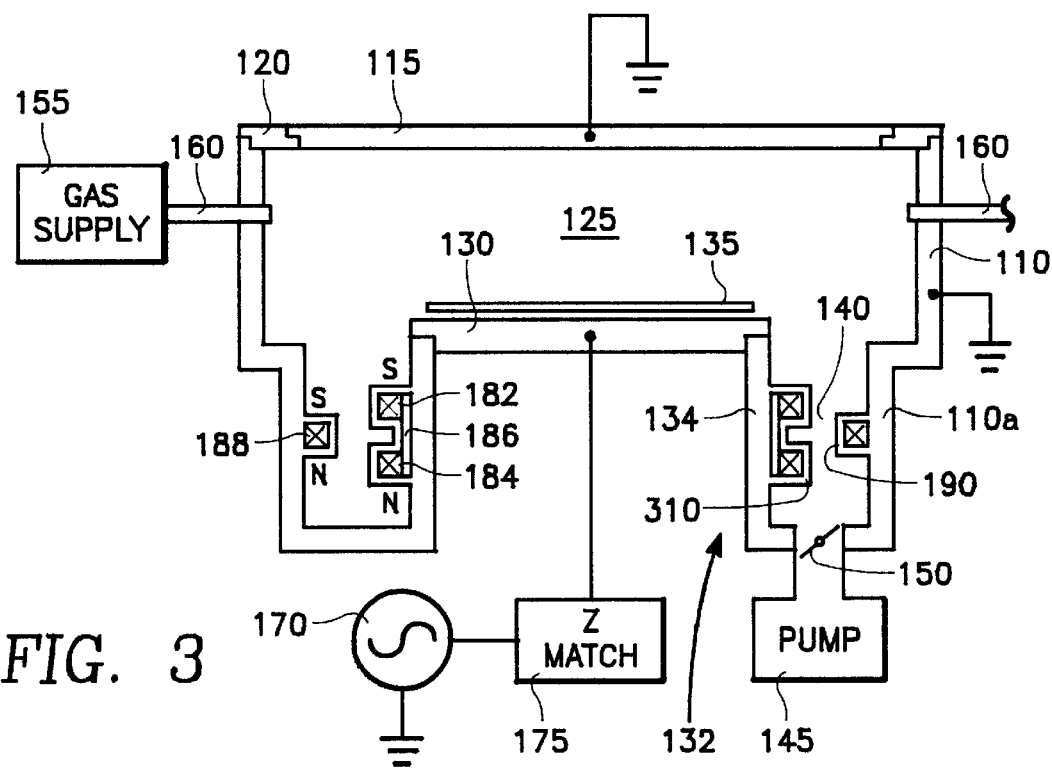
FIG. 3 illustrates a variation of the embodiment of FIG. 1 in which the magnets are located inside the chamber.

FIG. 3 illustrates a variation of the embodiment of FIG. 1 in which not only is the individual magnet 188 placed inside the pumping annulus but also the entire horseshoe magnet 182, 184, 186 is placed inside the pumping annulus. While the individual magnet 188 is placed on the surface of the side wall lower portion 110a inside the pumping annulus, the horseshoe magnet 182, 184, 186 is placed on the surface of the pedestal wall 134 inside the pumping annulus. As described above with reference to FIG. 1, the individual magnet 188 is protected by a thin aluminum film 190. Likewise, the horseshoe magnet is protected by an overlying aluminum film 310 as shown in FIG. 3.

Figure 4:
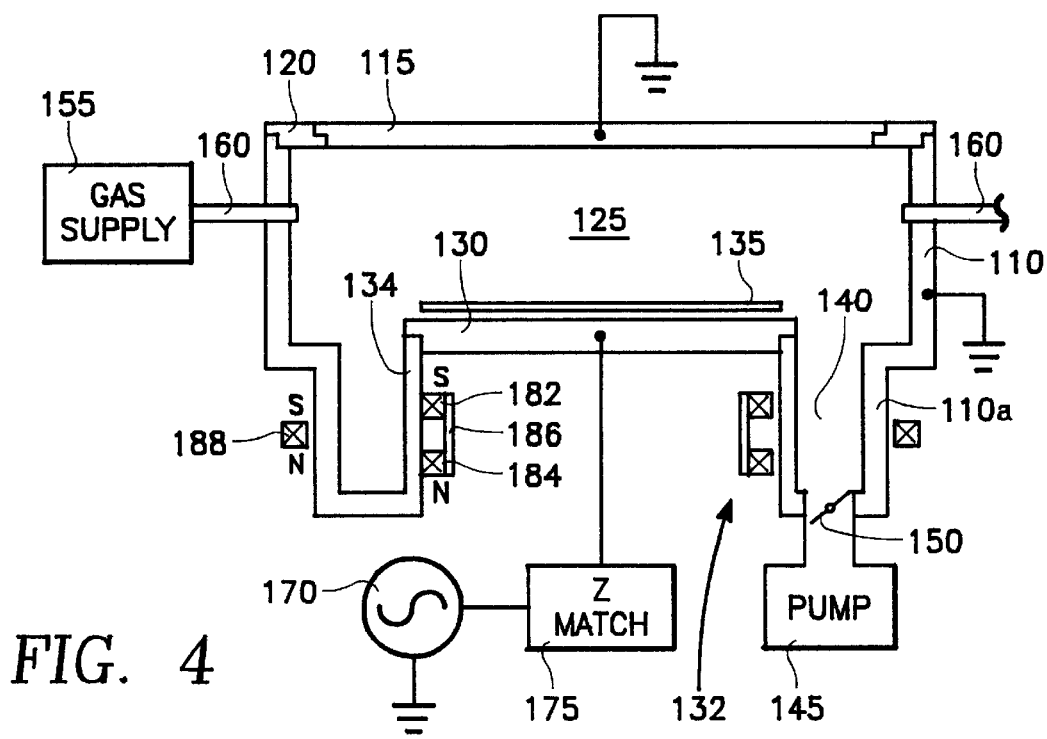
FIG. 4 illustrates an embodiment in which all the magnets are located outside the chamber.

FIG. 4 illustrates an embodiment in which all three magnets 182, 184 and 188 are placed outside of the pumping annulus 140. Specifically, the horseshoe magnet 182, 184, 186 is placed on the surface of the pedestal wall 134 outside the pumping annulus and the individual magnet is placed on the surface of the side wall lower portion 110a outside the pumping annulus 140. In FIG. 4, none of the magnets require any protective coating and therefore this embodiment is inexpensive. However, in the embodiment of FIG. 4 the distance between the magnet 188 and the horseshoe magnet 182, 184, 186 is greater than in the other embodiments, and therefore a greater pole displacement of the horseshoe magnet is required.

Figure 5A:
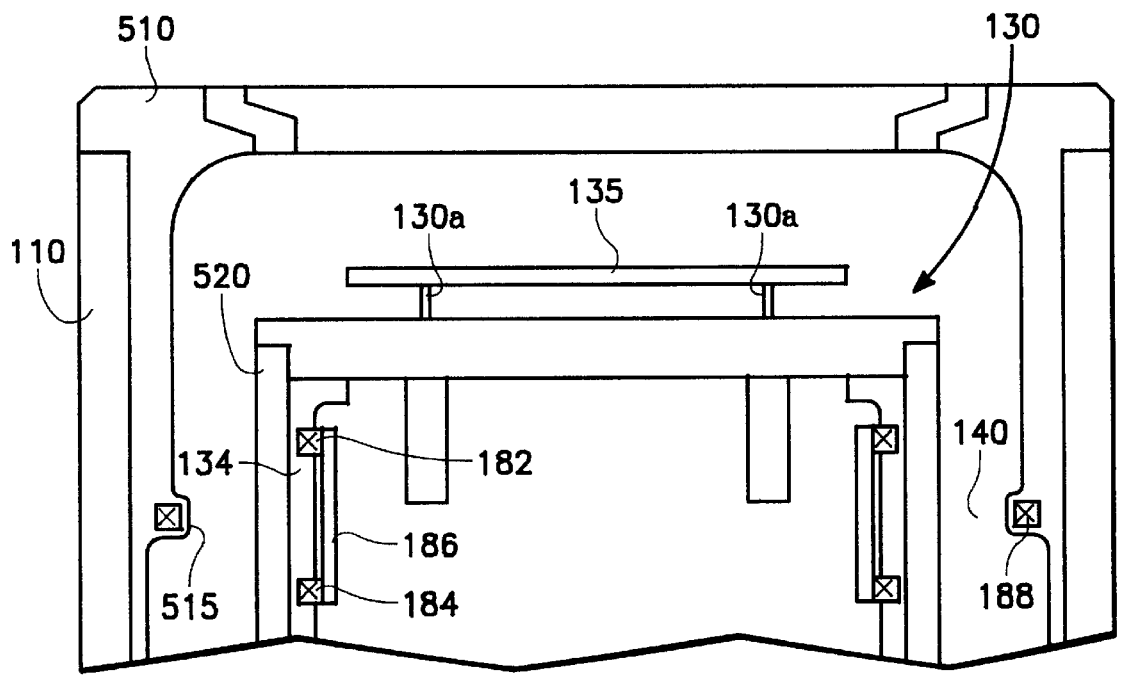
FIGS. 5A & 5B are enlarged views of the embodiment of FIG. 1.

FIG. 5A illustrates how the embodiment of FIG. 1 is implemented using liners oh the walls defining the pumping aperture 140. Specifically, a removable liner 510 covers the cylindrical side wall 110. The liner 510 includes a radially extending shelf 515 within which the individual magnet 188 is held. The liner 510 is formed of a hard material such as aluminum. A liner 520 covers the pedestal wall 134. Such liners maybe quickly removed and replaced whenever required due to corrosive surface wear or accumulation of contaminants, which would otherwise lead to an unacceptable change in reactor characteristics or degradation in performance. In the embodiment of FIG. 5A, the horseshoe magnet 182, 184, 186 is placed behind the pedestal wall 134, so that it does not require any special protective measures.

Figure 5B:
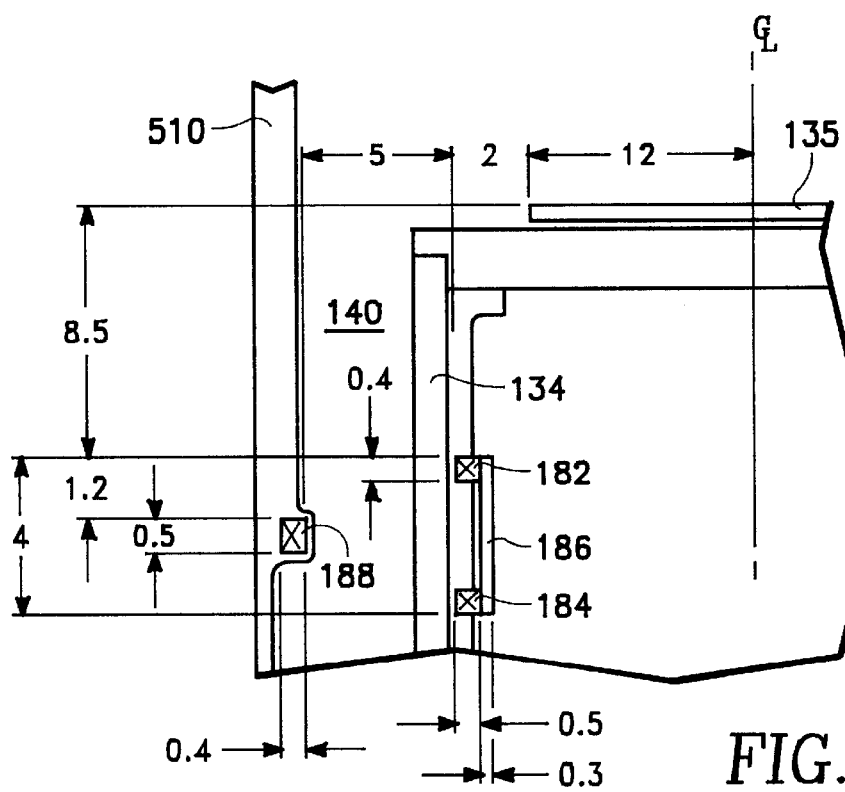
Figure 5C:
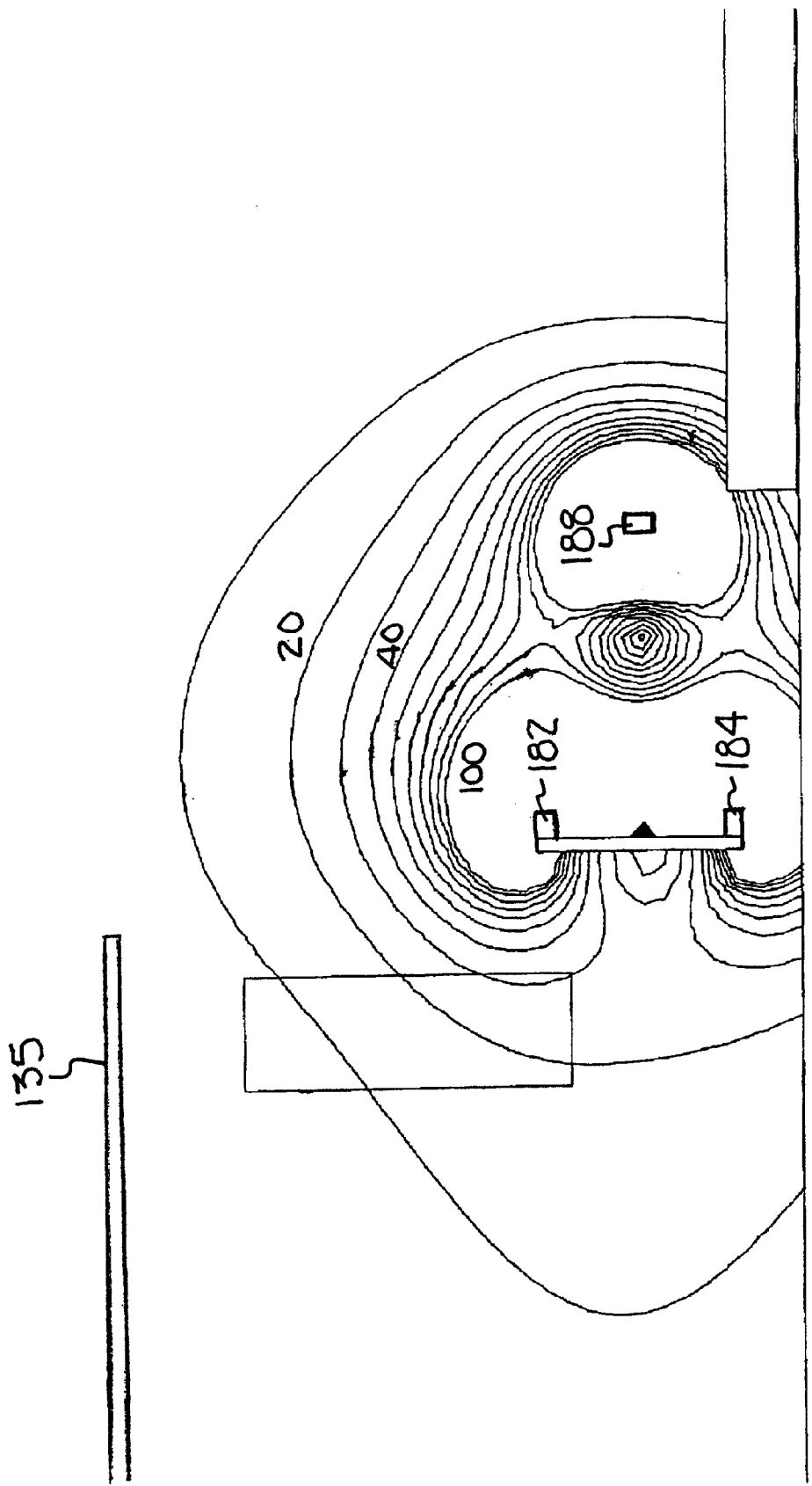
FIG. 5C illustrates a simulation of the magnetic field employed in the embodiment of FIG. 1.
Figure 5D:
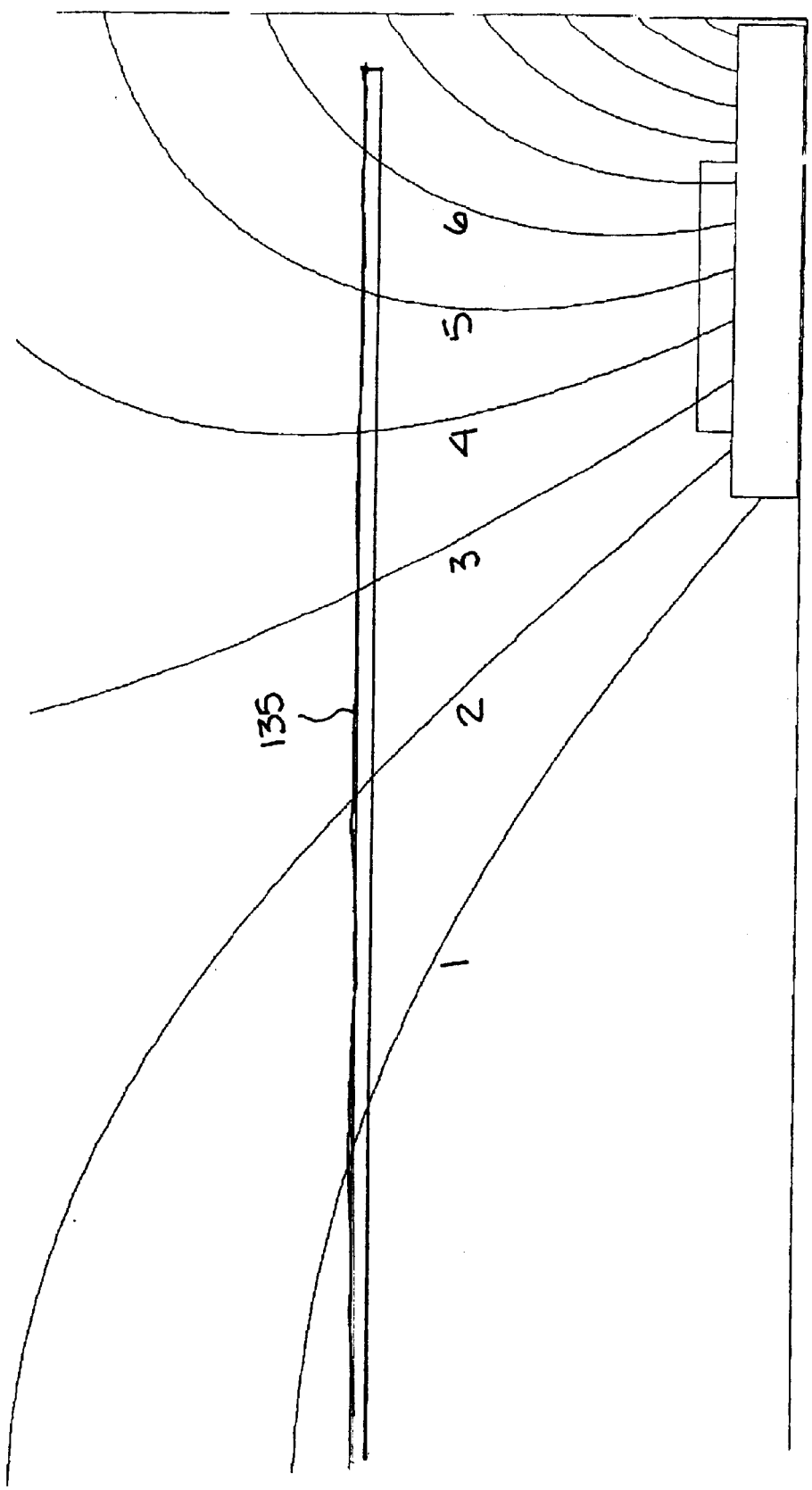

FIG. 5B illustrates certain normalized dimensions that can be used to implement either the embodiment of FIG. 5A or the embodiment of FIG. 1. These normalized dimensions were employed in a computer simulation of the magnetic field generated across the pumping annulus gap, and FIG. 5C illustrates the results of that simulation. In the simulation, it is assumed each of the magnets 182, 184, 188 is formed of many Samarium Cobalt magnets, as will be discussed below with reference to FIG. 14. The simulation of FIG. 5C is instructive in that it shows a continuous magnetic field line of 80 Gauss extending across the entire gap of the pumping annulus 140. Thus, for any charged particle to penetrate, it would have to overcome the deflective force of 80 Gauss. FIG. 5C also shows how the field strength decreases near the wafer 135. FIG. 5D is a magnified version of FIG. 5C near the wafer 135, and shows a maximum magnetic field strength near the wafer 135 of about 6 Gauss.

Figure 6A:
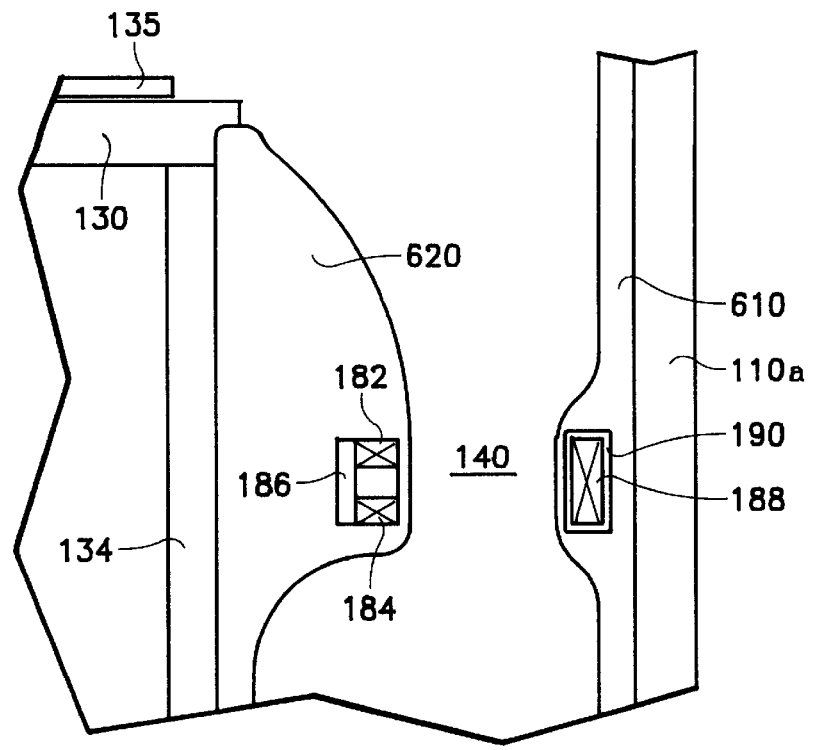
FIGS. 6A AND 6B are enlarged views of the embodiment of FIG. 3.

FIG. 6A illustrates how the embodiment of FIG. 3 is implemented using liners on the walls defining the pumping aperture 140. Specifically, a removable liner 610 covers the cylindrical side wall 110. The liner 610 supports the individual magnet 188, which is encapsulated in the protective aluminum coating 190. The liner 610 is formed of a hard material such as aluminum. A liner 620 covers the pedestal wall 134. In the embodiment of FIG. 6A, the horseshoe magnet 182, 184, 186 is placed inside the liner 620, so that the liner 620 protects the horseshoe magnet from the plasma.

Figure 6B:
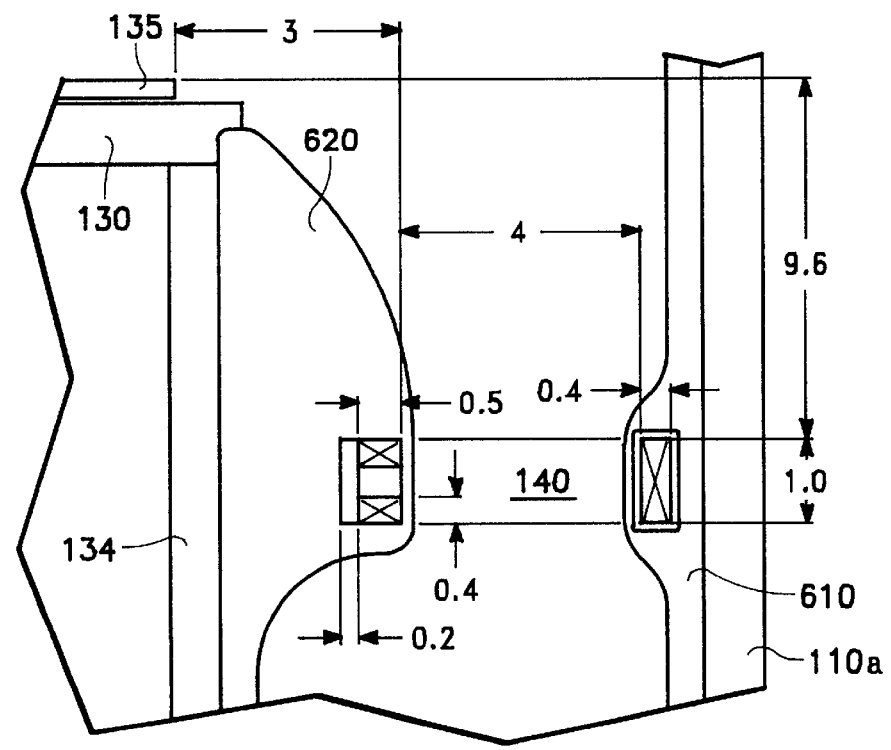
Figure 6C:
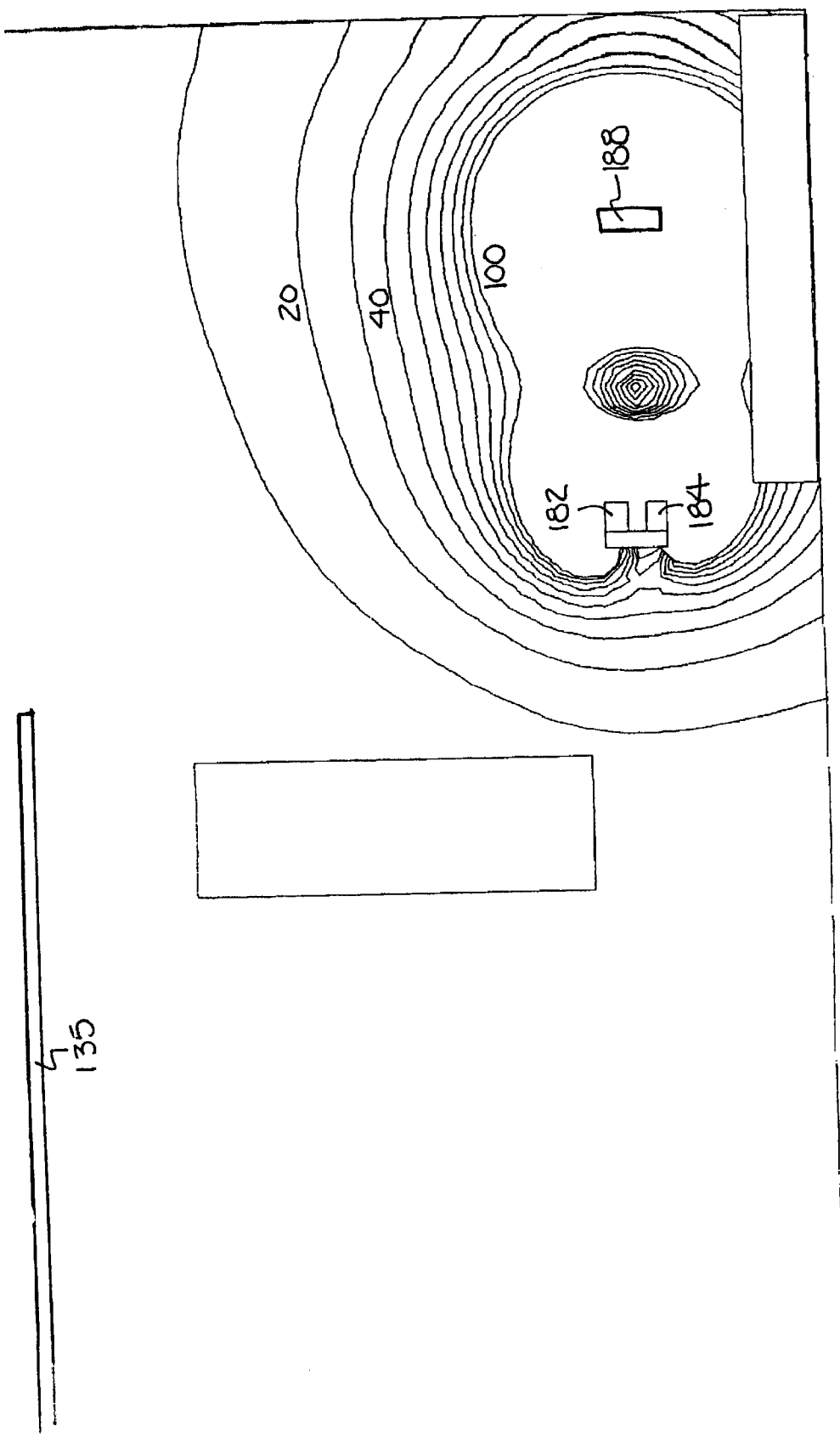
FIG. 6C illustrates a simulation of the magnetic field employed in the embodiment of FIG. 3.
Figure 6D:
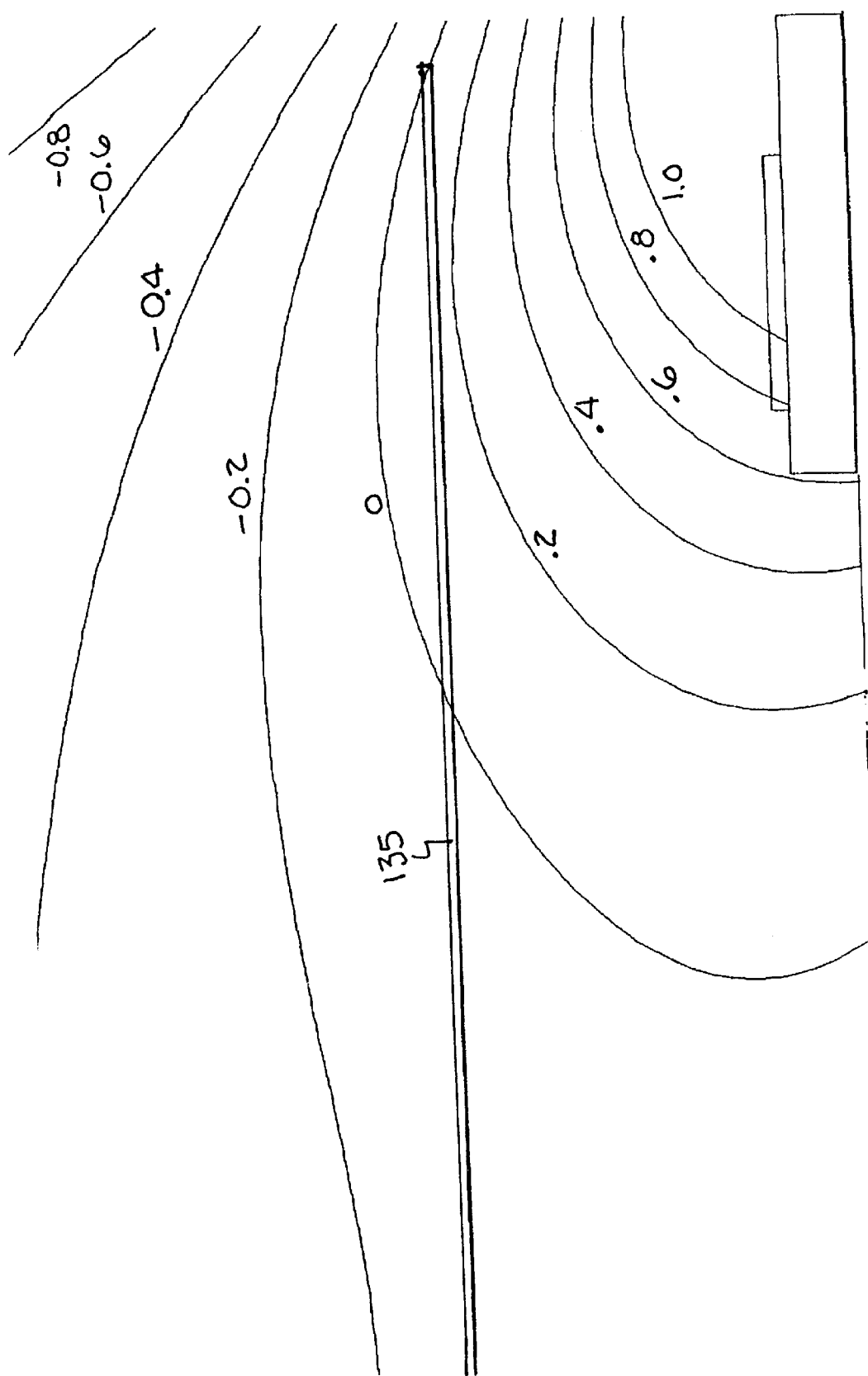
FIG. 6D is an enlargement of the magnetic field of FIG. 6C.

FIG. 6B illustrates certain normalized dimensions that can be used to implement either the embodiment of FIG. 6A or the embodiment of FIG. 3. These normalized dimensions were employed in a computer simulation of the magnetic field generated across the pumping annulus gap, and FIG. 6C illustrates the results of that simulation. In the simulation, it is assumed each of the magnets 182, 184, 188 is the same as that described above with reference to the simulation of FIG. 5C. The simulation of FIG. 6C is instructive in that it shows a continuous magnetic field line of 100 Gauss extending across the entire gap of the pumping annulus 140. Thus, for any charged particle to penetrate, it would have to overcome the deflective force of 100 Gauss. This field is stronger than the one obtained in the simulation of FIG. 5C because, for the same gap distance, the horseshoe magnet is somewhat closer to the individual magnet 188. FIG. 6C also shows how the field strength decreases near the wafer 135. FIG. 6D is a magnified version of FIG. 6C near the wafer 135, and shows a maximum magnetic field strength near the wafer 135 which is less than that obtained in the simulation of FIG. 5C. The difference is due at least in part to the greater radial distance of the horseshoe magnet from the wafer in the embodiment of FIG. 6A.

Figure 7:
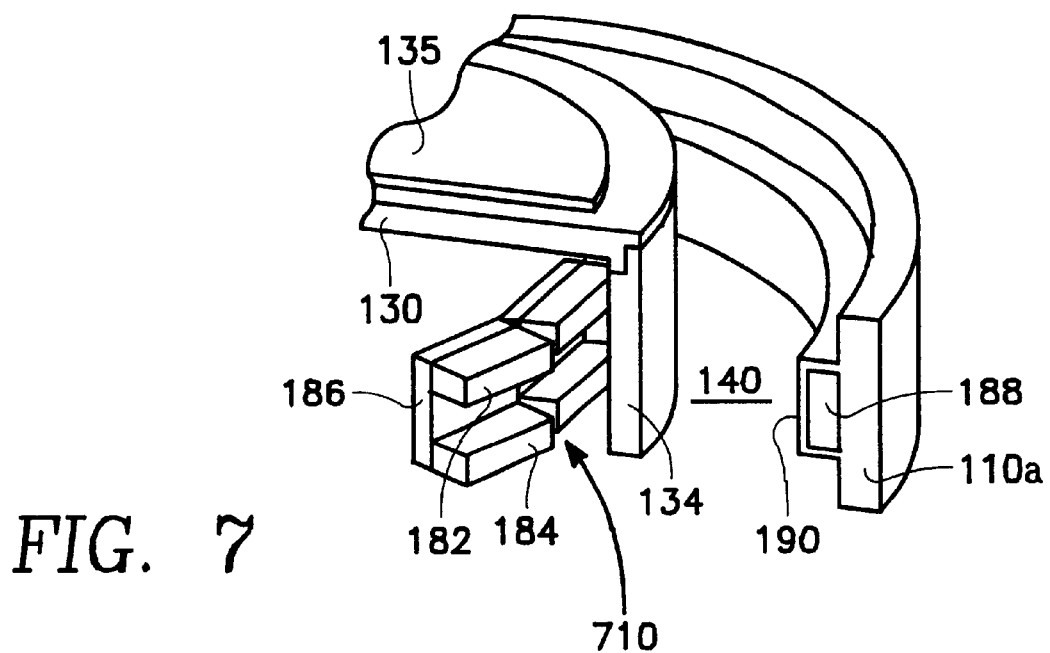
FIG. 7 is an enlarged detail view of the embodiment of FIG. 1.
Figure 8:
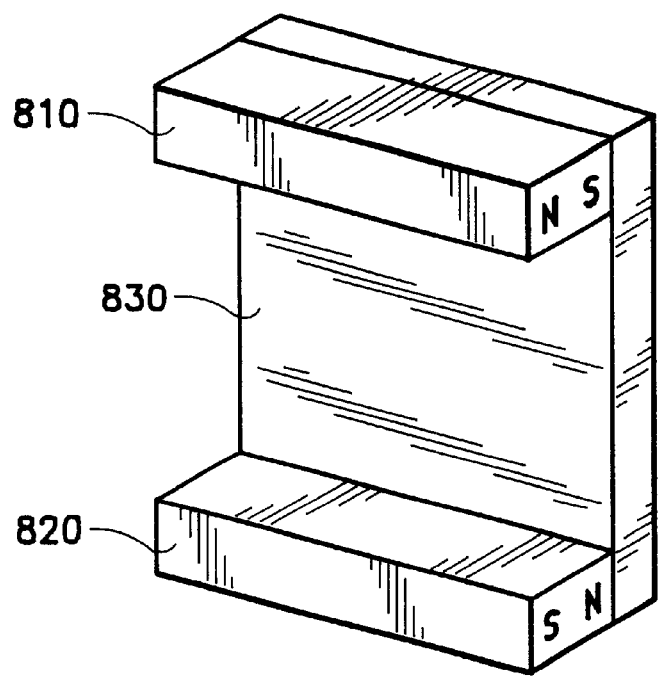
FIG. 8 illustrates an individual unit of the horseshoe magnet assembly.

FIG. 7 illustrates how the horseshoe magnet 182, 184, 186 at the pedestal 135 and the individual magnet 188 at the side wall 110 are formed from many individual solid rectangular magnet pieces 710 arranged side-by-side and defining an annulus. FIG. 18 illustrates an individual unit of the horseshoe magnet including an upper magnet piece 810, a lower magnet piece 820 and a steel backing piece 830 connecting the two magnet pieces 810, 820. In an actual implementation, each magnet piece was a solid rectangular Samarium Cobalt block with dimensions and magnetic orientation as illustrated in FIG. 8. Preferably, a non-magnetic metal such as aluminum is placed in the space bounded on three sides by the upper and lower magnet pieces 810, 820 and the backing piece 830.

FIG. 7 clearly shows that the horseshoe magnet 182, 184, 186 is a ring magnet extending 360 degrees around the circumference of the radially inner surface of the pedestal wall 134. Similarly, the individual magnet 188 is a ring magnet extending 360 degrees around the circumference of the radially outer surface of the side wall lower portion 110a.

Figure 9:
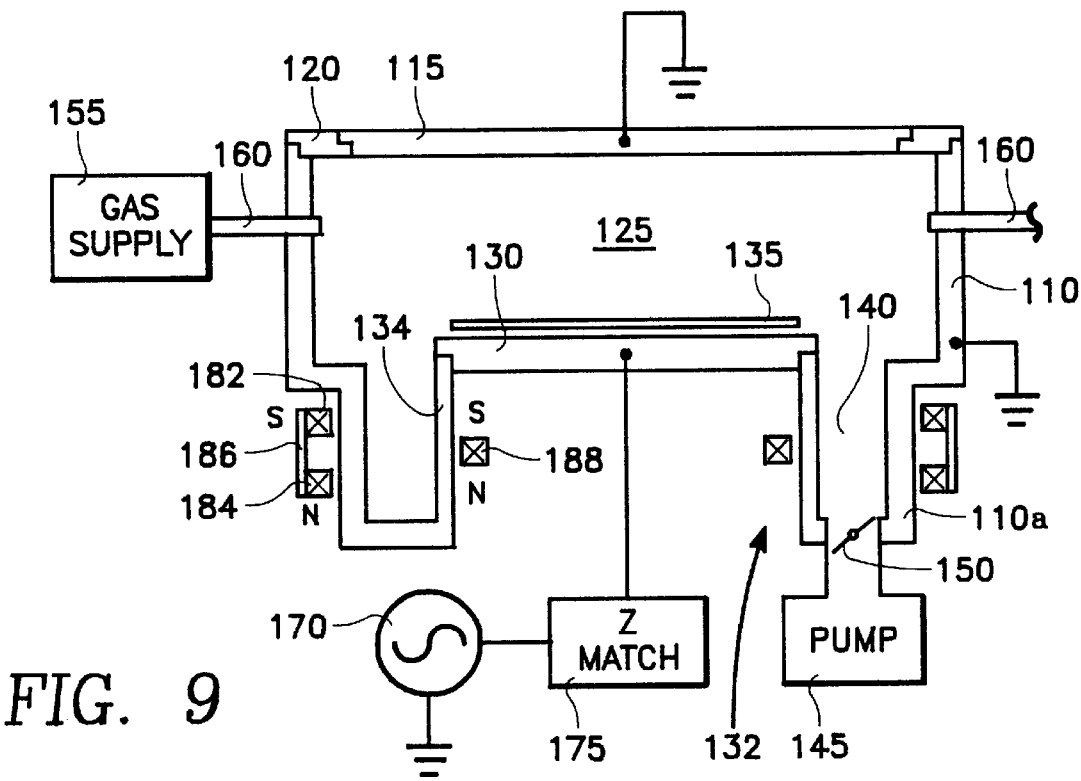
FIG. 9 illustrates an alternate embodiment of FIG. 4 with the positions of the magnets reversed.

FIG. 9 illustrates an alternative tri-magnet assembly in which the positions of the horseshoe magnet 182, 184, 186 and the individual magnet 188 are reversed, the horseshoe magnet being at the side wall 110 and the individual magnet being at the pedestal 130. In the embodiment of FIG. 9, all magnets are located outside of the pumping annulus 140.

Figure 10:
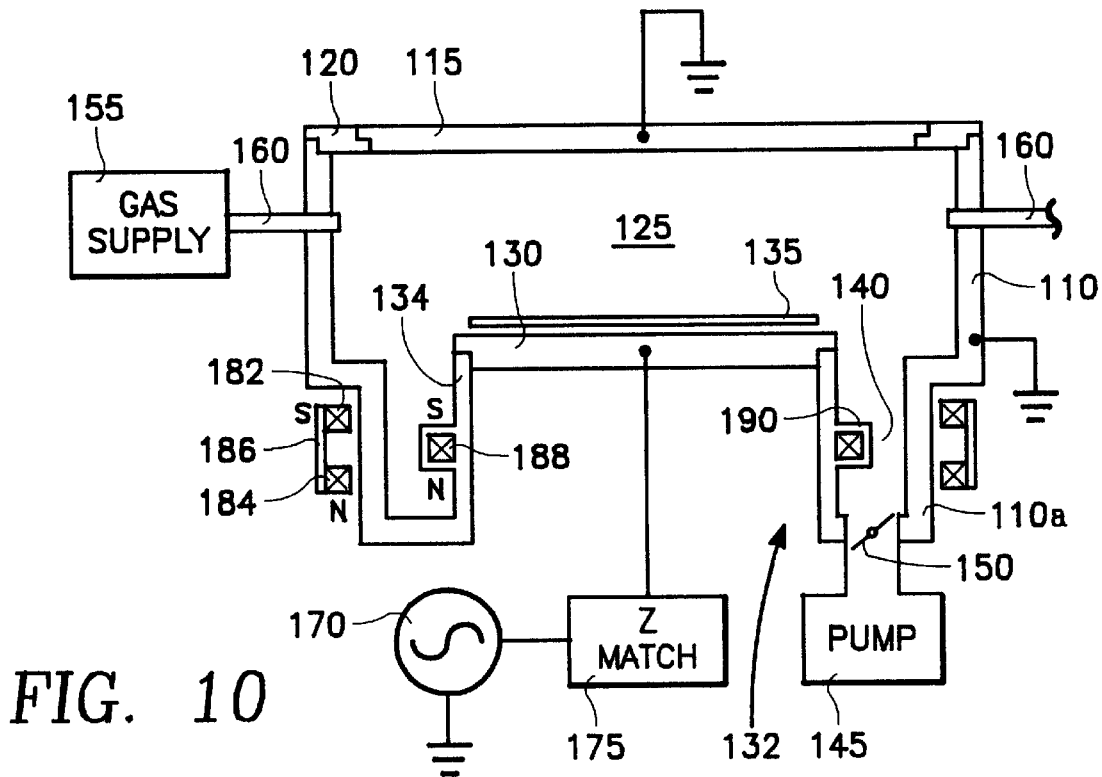
FIG. 10 illustrates a variation of FIG. 9.

FIG. 10 illustrates a variation of FIG. 9 in which the individual magnet 188 is placed inside the pumping annulus 140 on the pedestal wall 134 and is protected by a thin aluminum coating 190.

Figure 11:
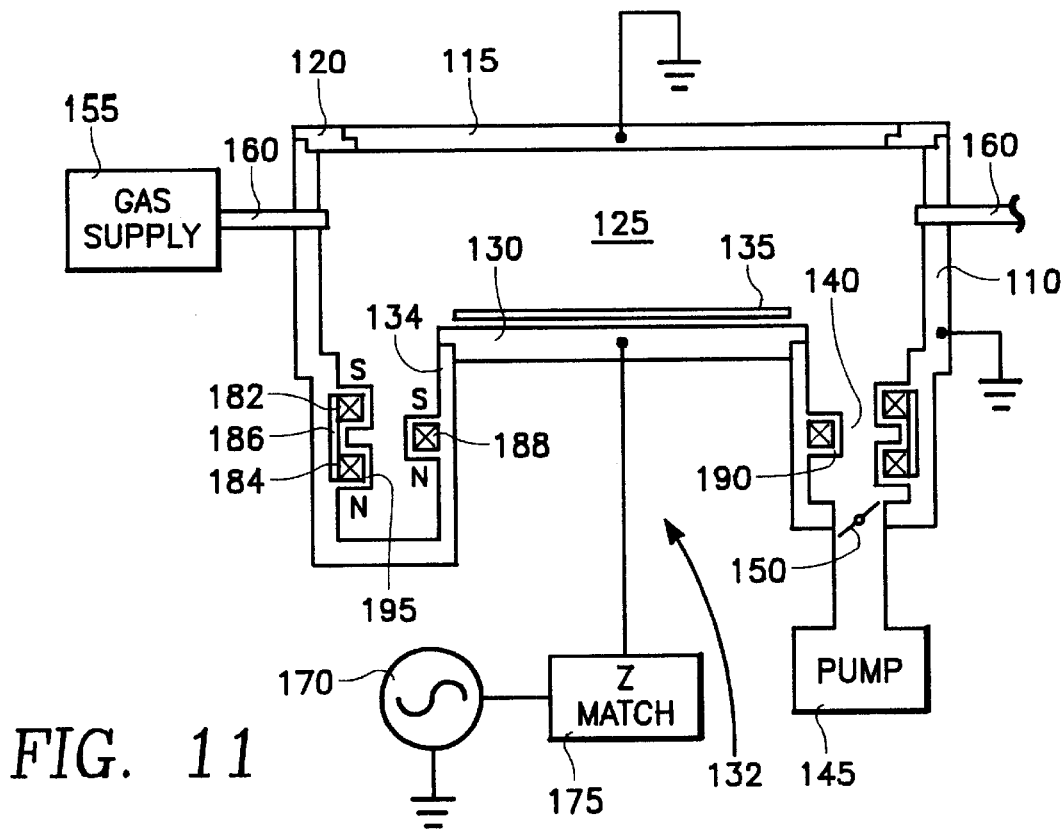
FIG. 11 illustrates a variation of FIG. 10.

FIG. 11 illustrates a variation of FIG. 10 in which both the individual magnet 188 and the horseshoe magnet are placed inside the pumping annulus on the pedestal wall 134 and the side wall 110, respectively. The individual magnet 188 is protected by the aluminum coating 190 while the horseshoe magnet is protected by an aluminum coating 195.

Figure 12:
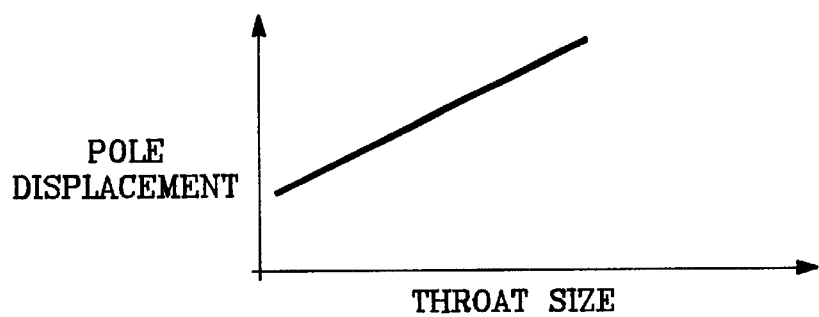
FIG. 12 is a graph illustrating an optimum pole displacement of the horseshoe magnets.

FIG. 12 is a graph illustrating an optimum pole displacement of the horseshoe magnet 182, 184, 186 as a function of pumping annulus gap size. The scale of the graph of FIG. 12 is not necessarily linear nor proportional and the graph is meant to illustrate that, for a desired minimum magnetic field strength across the gap, the pole displacement must generally increase as the gap size increases.

Figure 13:
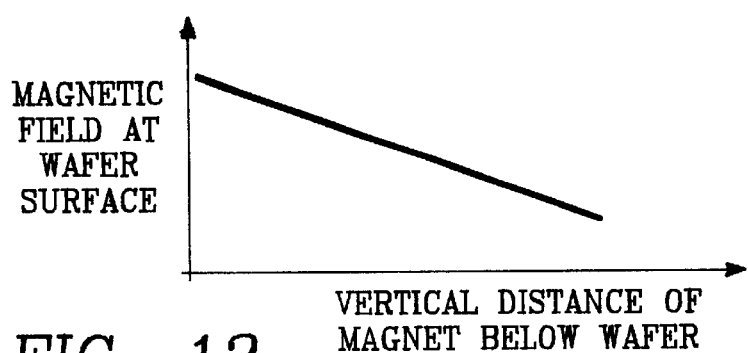
FIG. 13 is a graph illustrating the diminishing trend in the magnetic filed.

FIG. 13 is a graph illustrating the diminishing trend in the magnetic field at the wafer plane as the vertical displacement of the tri-magnet assembly below the wafer plane is increased. The scale of the graph of FIG. 13 is not necessarily linear nor proportional. This trend is exploited in minimizing the magnetic field on the wafer in the foregoing embodiments.

Figure 14A:
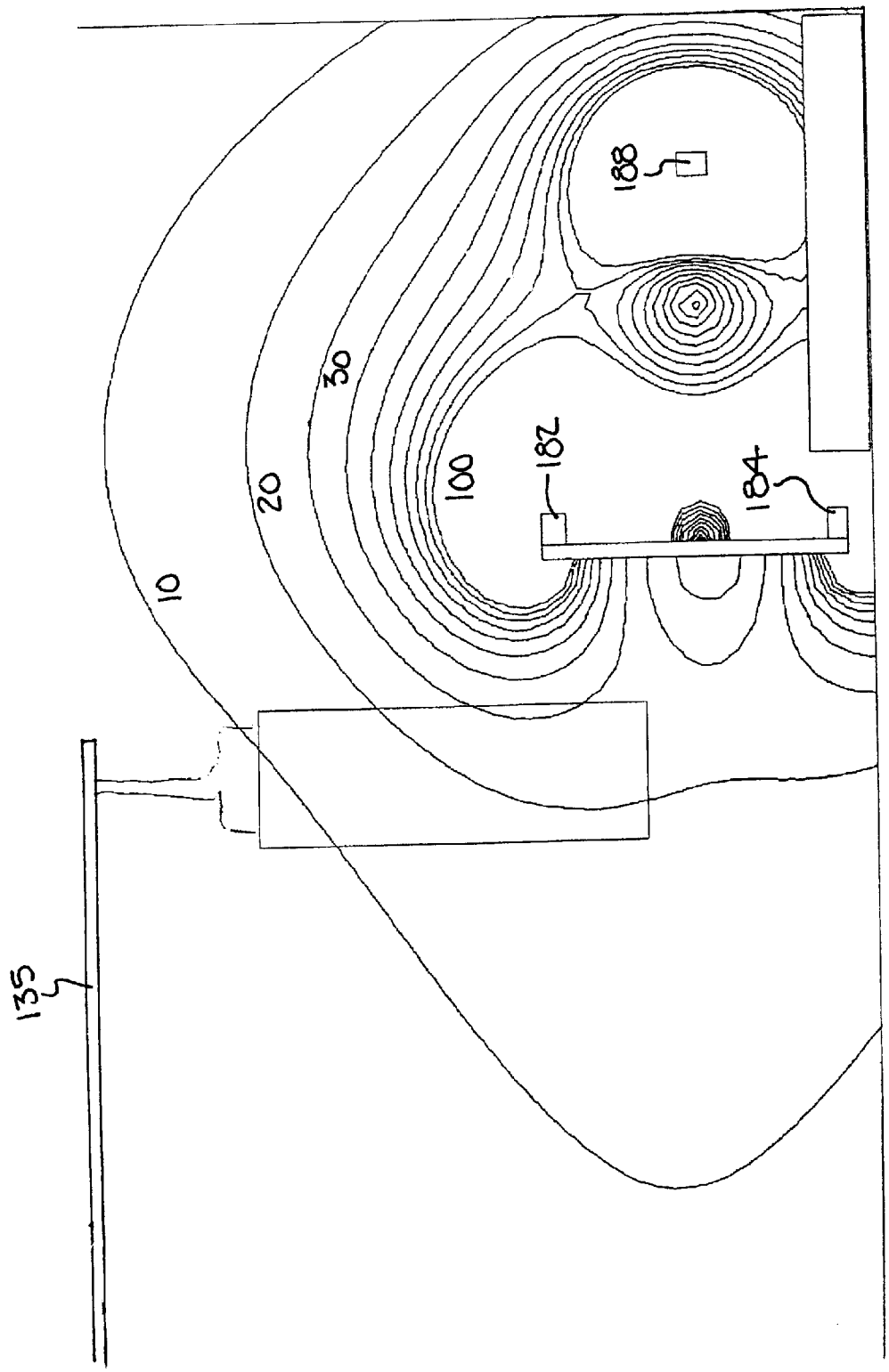
FIGS. 14A, 15A & 16A illustrate alternate magnetic fields using different tri-magnet configurations.
Figure 15A:
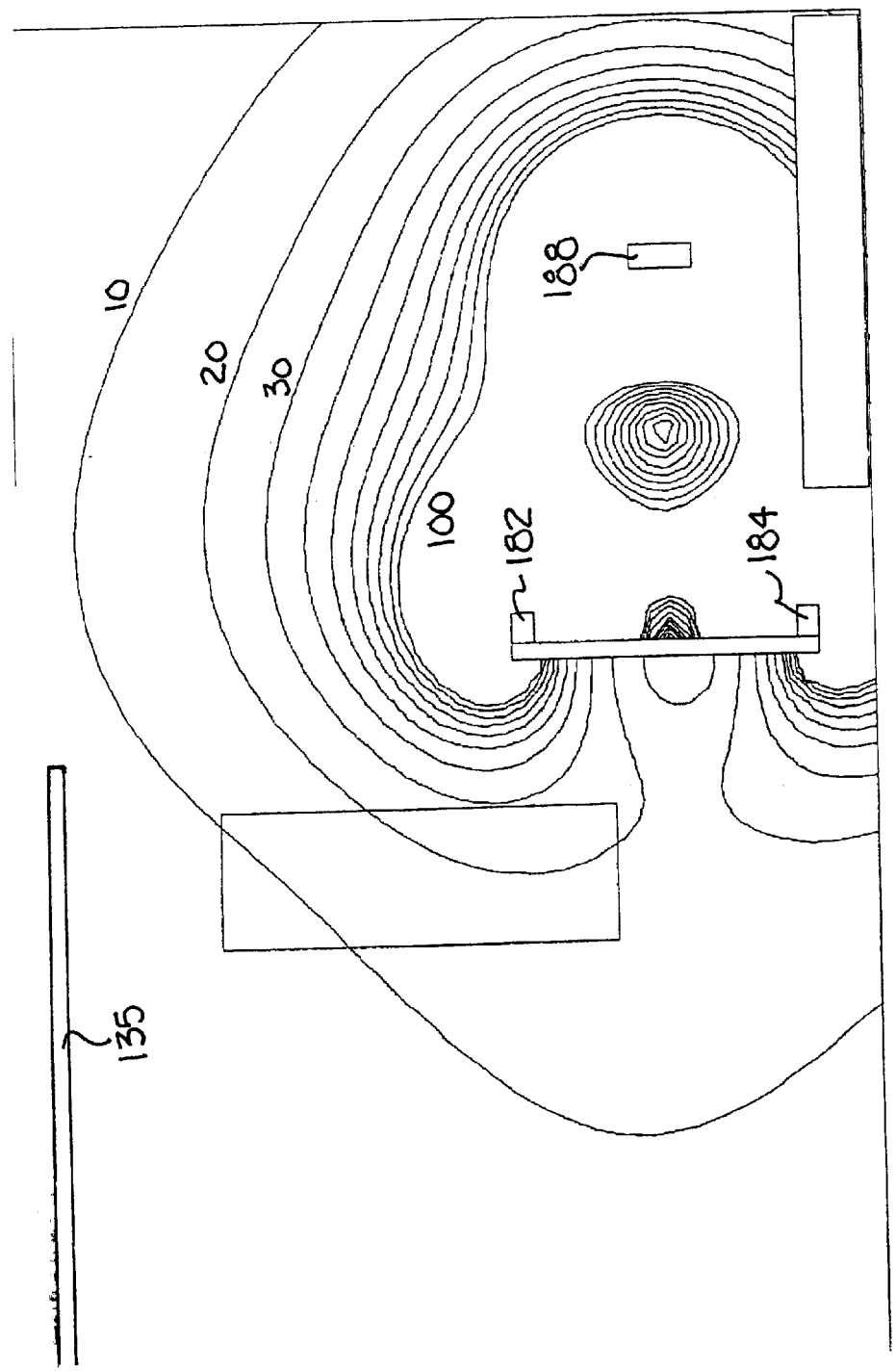
Figure 16A:
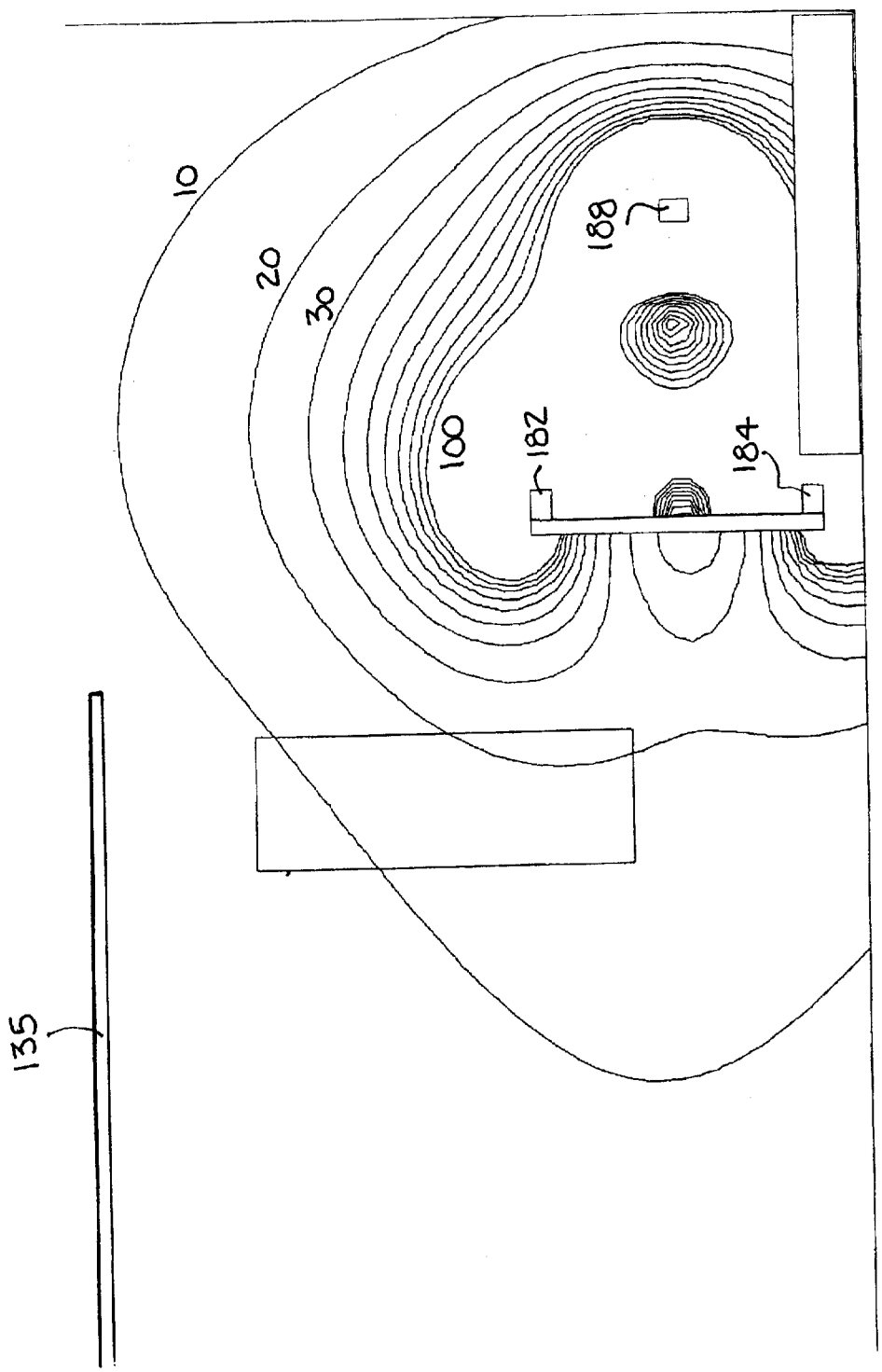

FIGS. 14A, 15A and 16A depict different tri-magnet configurations. The tri-magnet apparatus of FIG. 14A has a longer pole displacement of the horseshoe magnet, a larger gap and a smaller individual magnet 188 than that of FIG. 15A. The tri-magnet configuration of FIG. 16A has the smallest gap. The magnetic field strength across the gap is largest in FIG. 16A and smallest in FIG. 14A, due at least in part to the larger gap of FIG. 14A. Comparison of FIGS. 14A, 15A and 16A appears to indicate that the longer pole displacement of FIG. 14A at least partially compensates for the larger gap length. Moreover, it appears that variation in length of the individual magnet 188 has little appreciable effect on the magnetic field. Thus, it appears that little penalty is incurred by the relatively small size of the individual (third) magnet 188. This is advantageous because the small size of this magnet provides a significant cost savings.

Figure 14B:
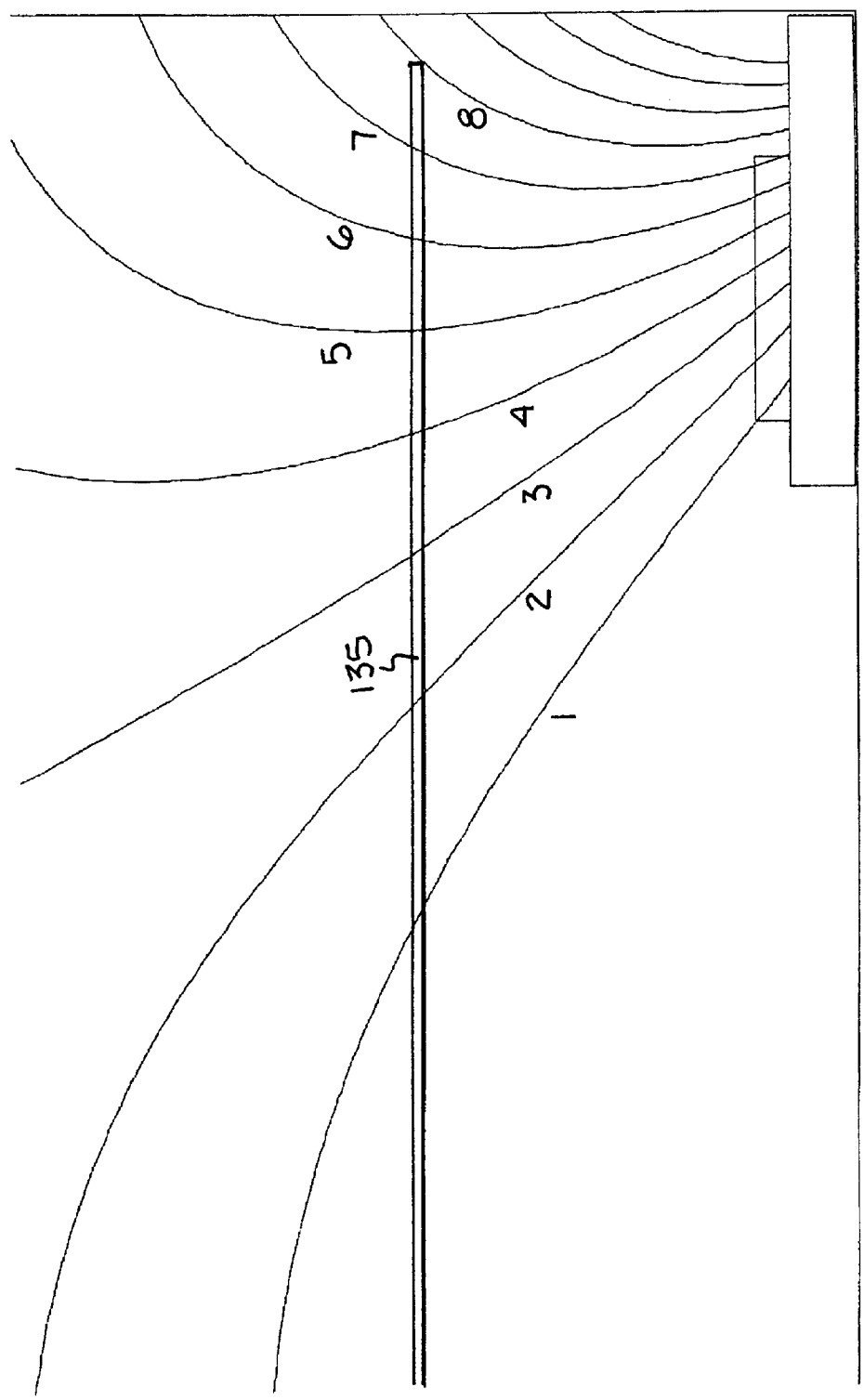
FIGS. 14B, 15B & 16B depict enlarged views of FIGS. 14A, 15A & 16A respectively.
Figure 15B:
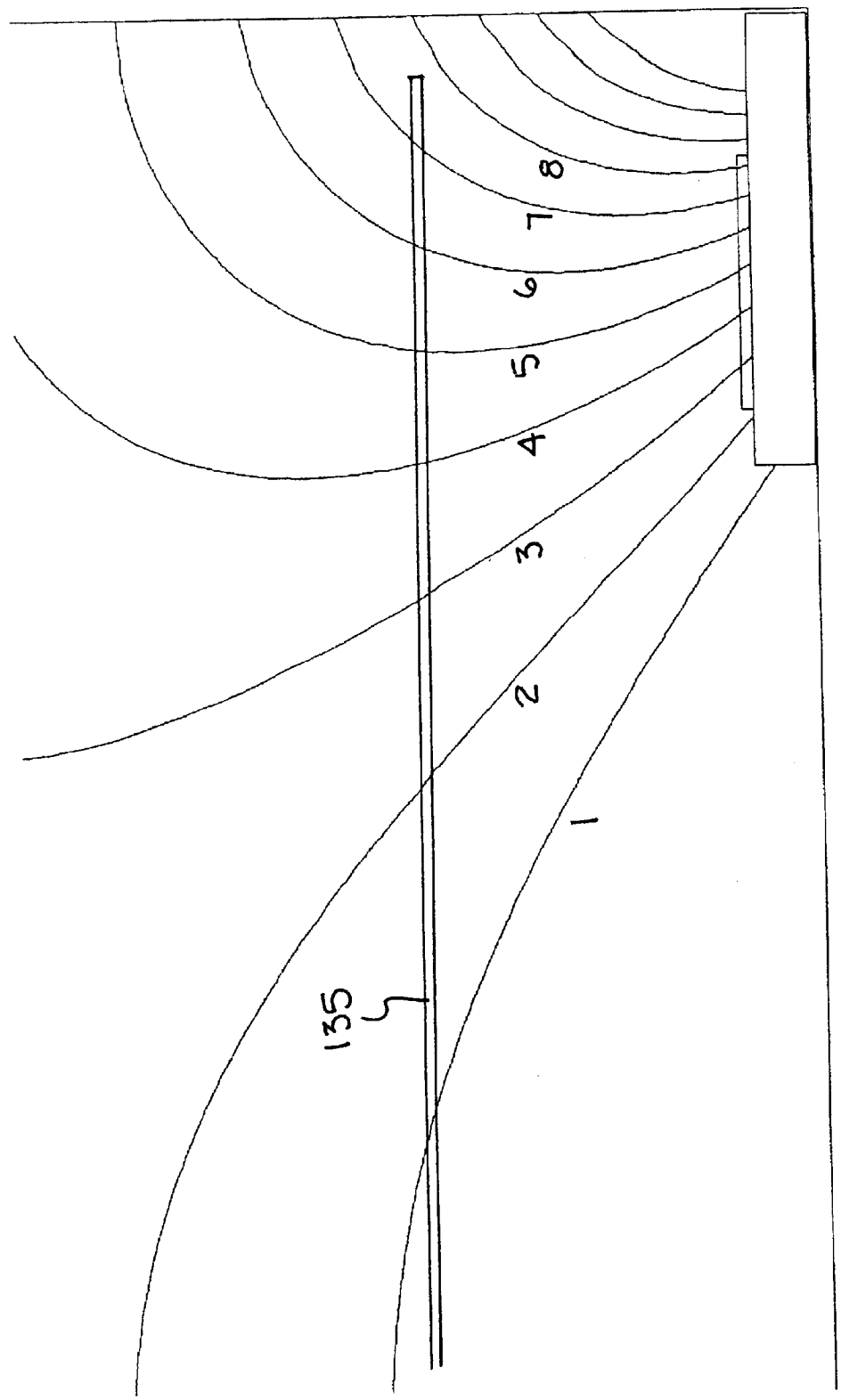
Figure 16B:
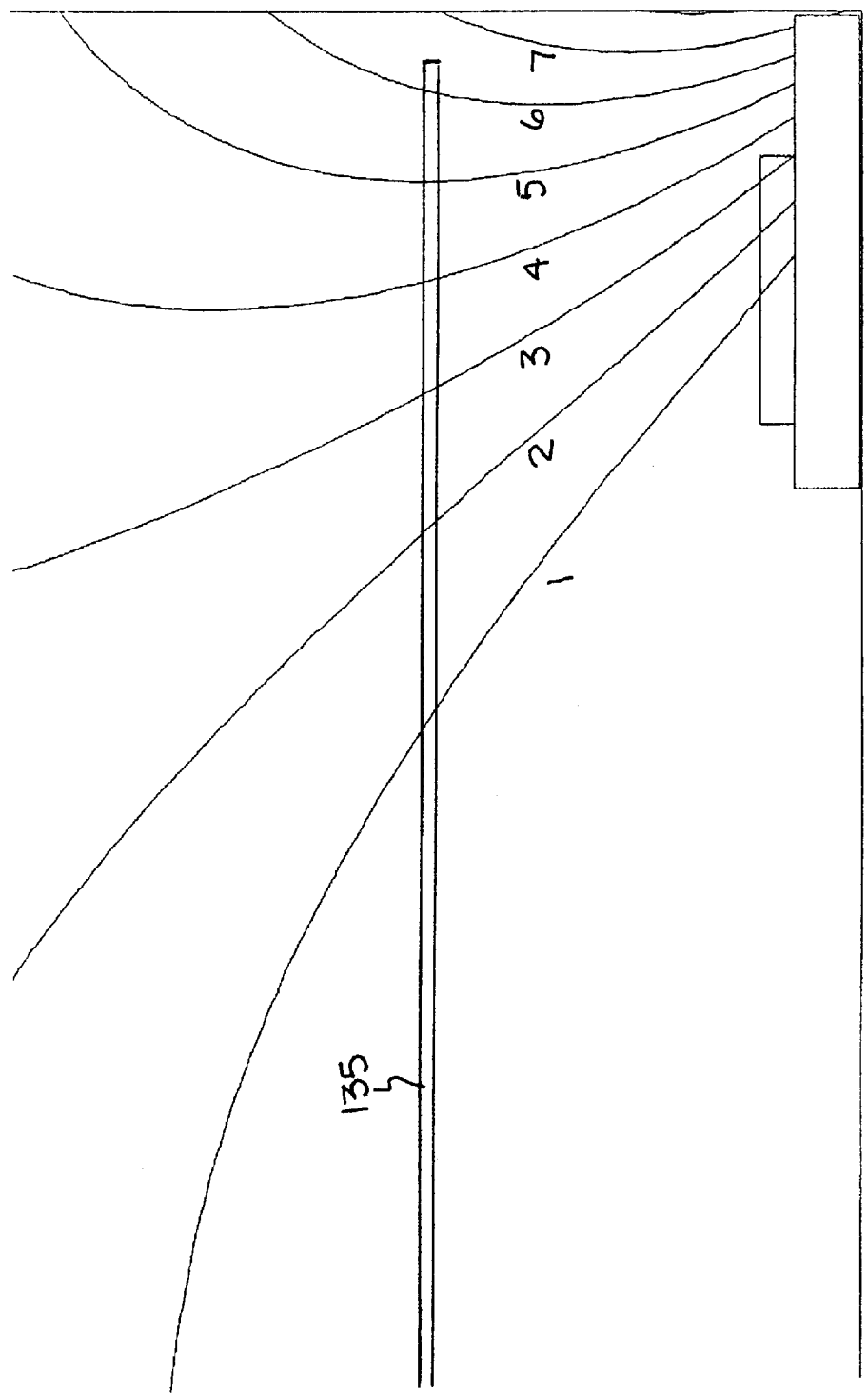

FIGS. 14B, 15B and 16B show that in each of these embodiments, the magnetic field strength in the wafer plane is advantageously low, namely about 8 Gauss or less. This minimizes the likelihood of device damage to the workpiece from plasma ions interacting with the magnetic field at the wafer plane.

In summary, the tri-magnet assembly provides effective magnetic confinement of the plasma across the very large gap that is required for low pressure processing of large wafers. It accomplishes this in a highly cost effective way heretofore not possible in that only a single small magnet ring (the individual magnet 188) disposed on the vacuum side of the side wall is embedded in a removable liner. The more expensive horseshoe magnet on the opposite side of the gap—at the pedestal—is not on the vacuum side of the pedestal wall and therefore does not affect the cost of replacement of the liner covering the pedestal wall, a significant advantage. The tri-magnet assembly can be scaled to permit enlargement of the gap as needed. This scaling is accomplished principally by adjusting (increasing) the pole displacement of the horseshoe magnet. If it is necessary to reduce the magnetic field in the wafer plane, further (independent) adjustment is accomplished by changing (increasing) the distance between the tri-magnet assembly and the wafer plane. By placing the horseshoe magnet on the wafer side of the gap instead of the individual magnet, the magnetic return field facing the wafer plane is tighter and does not extend as far toward the wafer, thus minimizing the magnetic field in the wafer plane.

While the invention has been described with reference to a preferred embodiment in which the tri-magnet apparatus confines plasma from a pumping annulus surrounding a wafer support pedestal, the invention may also find use in confining plasma from passageways other than a pumping annulus. For example, the passageway may be a slit valve of the chamber. In this case, the two elements of the tri-magnet assembly (i.e., the horseshoe magnet and the individual magnet) would be placed on opposing sides of the passageway. If chamber liners are used on or near the passageway, then one or both of two elements of the tri-magnet assembly may be placed in a respective chamber liner so that the two elements face each other across the passageway.

While the invention has been described with reference to an embodiment in which the larger magnet is a horseshoe magnet, in other embodiments the larger magnet may not be a horseshoe magnet but instead may appear to be a very long bar magnet. Such a long bar magnet may be constructed by placing two small bar magnets on opposite ends of a long magnetic backing piece, without a "horseshoe" shape. Nevertheless, the distance between the opposite poles of the long magnet would be governed by the principles set forth above governing the pole displacement of the horseshoe magnet.

While the invention has been described in detail by specific reference to preferred embodiments, it is understood that variations and modifications thereof may be made without departing from the true spirit and scope of the invention.

What is claimed is:

1. A plasma reactor comprising:

a ceiling and side wall defining a vacuum chamber with an axis of symmetry about said side wall, said side wall having a vacuum side radially inwardly facing the interior of said chamber;

a wafer support pedestal within said vacuum chamber facing said ceiling and having a pedestal wall having a vacuum side thereof radially outwardly facing a lower portion of said side wall and at least generally coaxial therewith whereby to define between said pedestal wall and said side wall a pumping annulus surrounding said wafer support pedestal;

a plasma-confining tri-magnet assembly, comprising:

a short magnet ring adjacent one wall, said one wall comprising one of said pedestal wall and said side wall, and at least generally coaxial with said one wall and having opposing poles spaced axially from one another by a gap distance which a fraction of the radial gap distance between said pedestal wall and said side wall, said short magnet ring having a magnetic orientation along one direction of said axis of symmetry;

an elongate magnet ring adjacent the other one of said pedestal wall and said side wall in generally facing relationship with said short magnet ring and at least generally coaxial with said other one wall and having opposing poles spaced axially from one another by a pole displacement distance which is at least nearly as great as said gap distance, said elongate magnet ring having a magnetic orientation along said axis of symmetry.

2. The reactor of claim 1 wherein said one wall is said side wall and said other one wall is said pedestal wall.

3. The reactor of claim 2 wherein:

said elongate magnet ring is mounted adjacent said pedestal wall opposite the vacuum side of pedestal wall; and said short magnet ring is mounted adjacent said side wall on the vacuum side of said side wall.

4. The reactor of claim 1 further comprising protective material on said short magnet ring to protect said short magnet ring from plasma.

5. The reactor of claim 4 wherein said protective material comprises a coating on said short magnet ring.

6. The reactor of claim 4 wherein said protective material comprises a chamber liner covering at least a portion of said side wall, said short magnet ring being disposed within said chamber liner.

7. The reactor of claim 1 wherein said elongate magnet ring comprises:
    upper and lower ring magnets displaced from one another by said pole displacement distance, the pole of one of said upper and lower ring magnets facing the opposite pole of the other;
    a backing of magnetic material connected between the facing poles of said upper and lower ring magnets, whereby the remaining poles of said upper and lower ring magnets are the poles of said elongate magnet ring.

8. The reactor of claim 7 wherein the opposite poles of each one of said upper and lower ring magnets are spaced radially from one another, the radial magnetic orientation of said upper ring magnet being opposite that of said lower ring magnet.

9. The reactor of claim 1 wherein said pole displacement of said short magnet ring is about one tenth the distance between said short magnet ring and said elongate magnet ring.

10. The reactor of claim 9 wherein said pole displacement of said elongate magnet ring is greater than half the distance between said short magnet ring and said elongate magnet ring.

11. The reactor of claim 10 wherein said pole displacement of said elongate magnet ring is greater than three-quarters of the distance between said short magnet ring and said elongate magnet ring.

12. The reactor of claim 1 wherein said pole displacement of said elongate magnet ring is sufficiently great such that said tri-magnet assembly maintains a sufficiently large magnetic field strength across said gap to effectively block plasma from passing through said pumping annulus.

13. The reactor of claim 12 wherein said magnetic field strength maintained by said tri-magnet assembly across said gap is greater than 80 Gauss and said gap is greater than 2 inches.

14. The reactor of claim 13 wherein said magnetic field strength is about 100 Gauss.

15. The reactor of claim 12 wherein:
    said wafer support pedestal has a workpiece plane facing said ceiling;
    said tri-magnet assembly is located along said axis of symmetry with a vertical displacement below said workpiece plane sufficient to minimize magnetic fields therefrom at said workpiece plane below a threshold sufficiently low to minimize device damage during wafer processing.

16. The reactor of claim 15 wherein said threshold is about less than 10 Gauss.

17. The reactor of claim 16 wherein said threshold is about 8 Gauss.

18. The reactor of claim 1 wherein said short magnet ring is axially located symmetrically with respect to the poles of said elongate magnet ring, whereby the axial location of said short magnet is about halfway between the axial locations of the poles of said elongate magnet ring.

19. The reactor of claim 1 wherein said elongate magnet ring extends at least nearly 360 degrees around said axis of symmetry.

20. The reactor of claim 1 wherein said short magnet ring extends at least nearly 360 degrees around said axis of symmetry.

21. The reactor of claim 1 wherein said wafer support pedestal has a diameter greater than 200 mm and the gap in said pumping annulus between said side wall and said pedestal wall is about 2 inches or greater.

22. The reactor of claim 21 wherein diameter of said wafer support pedestal is about 300 mm or greater and said gap exceeds 2 inches.

23. A plasma reactor comprising:
    a chamber adapted to support an evacuated plasma environment;
    a passageway connecting said chamber to a region external of said chamber, said passageway being defined by spaced opposing passageway walls establishing a passageway distance therebetween;
    a plasma-confining magnet assembly adjacent said passageway, comprising:
        a short magnet adjacent one of said passageway walls and having opposing poles spaced from one another by a gap distance which a fraction of said passageway distance, said short magnet having a magnetic orientation along one direction of said passageway;
        a long magnet adjacent the other one of said opposing passageway walls and generally facing said short magnet across said passageway and having opposing poles spaced from one another along a direction of said passageway by a pole displacement distance which is at least nearly as great as a gap distance.

24. The reactor of claim 23 wherein said short magnet is on a evacuated side of said one passageway wall while said long magnet is on a non-evacuated side of said other passageway wall.

25. The reactor of claim 24 further comprising protective material on said short magnet to protect said short magnet from plasma.

26. The reactor of claim 25 wherein said protective material comprises a coating on said short magnet.

27. The reactor of claim 25 wherein said protective material comprises a chamber liner covering at least a portion of said one passageway wall, said short magnet being disposed within said chamber liner.

28. The reactor of claim 23 wherein said long magnet comprises:
    upper and lower magnets displaced from one another by said pole displacement distance, a pole of one of said upper and lower magnets facing the opposite pole of the other;
    a backing of magnetic material connected between the facing poles of said upper and lower magnets, whereby the remaining poles of said upper and lower ring magnets are the poles of said long magnet.

29. The reactor of claim 28 wherein the opposite poles of each one of said upper and lower magnets are spaced transversely relative to said passageway from one another, the radial magnetic orientation of said upper magnet being opposite that of said lower magnet ring.

30. The reactor of claim 23 wherein said pole displacement of said short magnet is about one tenth of the distance between said short magnet and said long magnet.

31. The reactor of claim 30 wherein said pole displacement of said long magnet is greater than half the distance between said short magnet and said long magnet.

32. The reactor of claim 31 wherein said pole displacement of said long magnet is greater than three-quarters of the distance between said short magnet and said long magnet.

33. The reactor of claim 23 wherein said pole displacement of said long magnet is sufficiently great such that said plasma-confining magnet assembly maintains a sufficiently large magnetic field strength across said gap distance to effectively block plasma from passing through said passageway.

34. The reactor of claim 33 wherein said magnetic field strength is greater than 80 Gauss and said gap distance is greater than 2 inches.

35. The reactor of claim 34 wherein said magnetic field strength is about 100 Gauss.

36. The reactor of claim 34 further comprising:
a wafer support pedestal having a workpiece plane above said passageway;
wherein said magnet assembly has a vertical displacement below said workpiece plane sufficient to minimize magnetic fields therefrom at said workpiece plane below a threshold sufficiently low to minimize device damage during wafer processing.

37. The reactor of claim 36 wherein said threshold is about less than 10 Gauss.

38. The reactor of claim 37 wherein said threshold is about 8 Gauss.

39. The reactor of claim 23 wherein said short magnet is axially located symmetrically with respect to the poles of said long magnet, whereby the axial location of said short magnet is about halfway between the axial locations of the poles of said long magnet.

40. The reactor of claim 23 wherein said opposing passageway walls are the opposing walls of a pumping annulus surrounding a wafer support pedestal.

41. The reactor of claim 40 wherein each of said short magnet and said long magnet is a ring magnet.

42. A plasma reactor comprising:
a ceiling and side wall defining a vacuum chamber with an axis of symmetry about said side wall, said side wall having a vacuum side radially inwardly facing the interior of said vacuum chamber;
a wafer support pedestal within said vacuum chamber facing said ceiling and having a pedestal wall having a vacuum side thereof radially outwardly facing a lower portion of said side wall and at least generally coaxial therewith whereby to define between said pedestal wall and said side wall a pumping annulus surrounding said wafer support pedestal;
a removable disposable side wall chamber liner within said pumping annulus and covering said side wall;
a plasma-confining tri-magnet assembly, comprising:
a short magnet ring embedded in said side wall chamber liner and at least generally coaxial with said one wall and having opposing poles spaced axially from one another by a gap distance which a fraction of the radial gap distance between said pedestal wall and said side wall, said short ring magnet having a magnetic orientation along one direction of said axis of symmetry;
an elongate magnet ring adjacent said pedestal wall in generally facing relationship with said short magnet ring and at least generally coaxial therewith and having opposing poles spaced axially from one another by a pole displacement distance which is at least nearly as great as said gap distance, said elongate magnet ring having a magnetic orientation along said axis of symmetry.

43. The reactor of claim 42 wherein:
said elongate magnet ring is mounted adjacent said pedestal wall outside of said pumping annulus.

44. The reactor of claim 42 wherein said elongate magnet ring comprises:
upper and lower ring magnets displaced from one another by said pole displacement distance, the pole of one of said upper and lower ring magnets facing the opposite pole of the other;
a backing of magnetic material connected between the facing poles of said upper and lower ring magnets, whereby the remaining poles, of said upper and lower ring magnets are the poles of said elongate magnet ring.

45. The reactor of claim 44 wherein the opposite poles of each one of said upper And lower ring magnets are spaced radially from one another, the radial magnetic orientation of said upper ring magnet being opposite that of said lower ring magnet.

46. The reactor of claim 42 wherein said pole displacement of said short magnet ring is about one tenth the distance between said short magnet ring and said elongate magnet ring.

47. The reactor of claim 46 wherein said pole displacement of said elongate magnet ring is greater than half the distance between said short magnet ring and said elongate magnet ring.

48. The reactor of claim 47 wherein said pole displacement of said elongate magnet ring is greater than three-quarters of the distance between said short magnet ring and said elongate magnet ring.

49. The reactor of claim 42 wherein said pole displacement of said elongate magnet ring is sufficiently great such that said tri-magnet assembly maintains a sufficiently large magnetic field strength across said gap to effectively block plasma from passing through said pumping annulus.

50. The reactor of claim 49 wherein said magnetic field strength maintained by said tri-magnet assembly across said gap is greater than 80 Gauss and said gap is greater than 2 inches.

51. The reactor of claim 50 wherein said magnetic field strength is about 100 Gauss.

52. The reactor of claim 49 wherein:
said wafer support pedestal has a workpiece plane facing said ceiling;
said tri-magnet assembly is located along said axis of symmetry with a vertical displacement below said workpiece plane sufficient to minimize magnetic fields therefrom at said workpiece plane below a threshold sufficiently low to minimize device damage during wafer processing.

53. The reactor of claim 52 wherein said threshold is about less than 10 Gauss.

54. The reactor of claim 53, wherein said threshold is about 8 Gauss.

55. The reactor of claim 42 wherein said short magnet ring is axially located symmetrically with respect to the poles of said elongate magnet, whereby the axial location of said short magnet ring is about halfway between the axial locations of the poles of said elongate magnet ring.

56. The reactor of claim 42 wherein said elongate magnet ring extends at least nearly 360 degrees around said axis of symmetry.

57. The reactor of claim 42 wherein said short magnet ring extends at least nearly 360 degrees around said axis of symmetry.

58. The reactor of claim 42 wherein said wafer support pedestal has a diameter greater than 200 mm and the gap in said pumping annulus between said side wall and said pedestal wall is about 2 inches or greater.

59. The reactor of claim 58 wherein diameter of said wafer support pedestal is about 300 mm or greater and said gap exceeds 2 inches.

60. A method for processing a workpiece supported on a wafer pedestal in a vacuum chamber of a plasma reactor while magnetically confining a plasma within the vacuum chamber from entering a passageway extending between the vacuum chamber and a region external thereto, said passageway having a width, said method comprising:

providing an elongate magnet adjacent one side of said passageway;

providing an individual magnet adjacent an opposite side of said passageway having a pole displacement between its opposite poles which is a fraction of said width, and facing said individual magnet towards said elongate magnet across said passageway; and providing a sufficiently large pole displacement between the opposite poles of said elongate magnet to maintain a strength of a magnetic field crossing said passageway sufficient to substantially prevent plasma from entering said passageway.

61. The method of claim 60 further comprising providing a sufficiently large displacement between said elongate magnet and a workpiece plane of said wafer pedestal to maintain a magnetic field at said workpiece plane below a device damage threshold level.

62. The method of claim 60 wherein said elongate magnet pole displacement is greater than half of said width.

63. The method of claim 62 wherein said magnetic field strength across said passageway exceeds approximately 80 Gauss.

64. The method of claim 61 wherein said threshold is about 8 Gauss.

* * * * *